United States Patent
Takada et al.

(10) Patent No.: US 11,087,852 B2
(45) Date of Patent: Aug. 10, 2021

(54) SEMICONDUCTOR STORAGE DEVICE AND MEMORY SYSTEM

(71) Applicant: TOSHIBA MEMORY CORPORATION, Tokyo (JP)

(72) Inventors: Yumi Takada, Yokohama Kanagawa (JP); Yasuhiro Hirashima, Kawasaki Kanagawa (JP); Kenta Shibasaki, Kamakura Kanagawa (JP); Yousuke Hagiwara, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/557,879

(22) Filed: Aug. 30, 2019

(65) Prior Publication Data

US 2020/0185044 A1 Jun. 11, 2020

(30) Foreign Application Priority Data

Dec. 7, 2018 (JP) .............................. JP2018-230105

(51) Int. Cl.
| | | |
|---|---|---|
| *G06F 12/00* | (2006.01) | |
| *G11C 16/32* | (2006.01) | |
| *G11C 16/04* | (2006.01) | |
| *G06F 3/06* | (2006.01) | |
| *G11C 16/26* | (2006.01) | |

(52) U.S. Cl.
CPC ............ *G11C 16/32* (2013.01); *G06F 3/0604* (2013.01); *G06F 3/0659* (2013.01); *G06F 3/0679* (2013.01); *G11C 16/0483* (2013.01); *G11C 16/26* (2013.01)

(58) Field of Classification Search
CPC ..... G11C 16/32; G11C 16/0483; G11C 16/26; G06F 3/0604; G06F 3/0659; G06F 3/0679
See application file for complete search history.

(56) References Cited

U.S. PATENT DOCUMENTS

| | | | |
|---|---|---|---|
| 8,730,757 B2 | 5/2014 | Shimizu | |
| 9,369,118 B2 | 6/2016 | Nakata | |
| 9,590,606 B2 | 3/2017 | Kitagawa et al. | |
| 2012/0072650 A1 | 3/2012 | Suzumura et al. | |
| 2014/0279759 A1 | 9/2014 | Yang et al. | |
| 2016/0104520 A1* | 4/2016 | Kang ................. | G11C 16/0483 365/233.1 |
| 2017/0053684 A1* | 2/2017 | Choi ...................... | G11C 16/32 |
| 2017/0308328 A1 | 10/2017 | Lim et al. | |
| 2017/0364276 A1* | 12/2017 | Bhuiyan ................ | G11C 7/222 |

(Continued)

FOREIGN PATENT DOCUMENTS

| | | |
|---|---|---|
| JP | 2012068873 A | 4/2012 |
| JP | 2016012204 A | 1/2016 |
| JP | 2017194966 A | 10/2017 |

*Primary Examiner* — John A Lane
(74) *Attorney, Agent, or Firm* — Kim & Stewart LLP

(57) ABSTRACT

A semiconductor storage device includes a first chip and a second chip. In response to a first command that is received on a first terminal of the first chip and a second terminal of the second chip that are connected to a command signal line, the first chip and the second chip execute in parallel a first correction process of correcting a duty cycle of a first output signal generated by the first chip and a second correction process of correcting a duty cycle of a second output signal generated by the second chip, respectively, according a common toggle signal.

20 Claims, 20 Drawing Sheets

(56) References Cited

U.S. PATENT DOCUMENTS

2018/0350414 A1* 12/2018 Park ................. G11C 7/222
2019/0348095 A1* 11/2019 Koh .................. G11C 7/109
2020/0162066 A1*  5/2020 Gans ................ G11C 29/023

* cited by examiner

FIG. 9

| CNT3 | | | SELECTION RESULT (CONTROL VALUE) OF MULTIPLEXER 253 | OUTPUT RESULT OF MULTIPLEXER 253 |
|---|---|---|---|---|
| DCC_EN | DCC_DONE | DCC_INIT | | |
| L | L | L | 1 | FACTORY CODE (FC) |
| L | H | L | 0 | CORRECTION CODE (CC) |
| H | L | L | 0 | CORRECTION CODE (CC) |
| H | H | L | 0 | CORRECTION CODE (CC) |
| | | H | 1 | FACTORY CODE (FC) |

SEMICONDUCTOR STORAGE DEVICE AND MEMORY SYSTEM

CROSS-REFERENCE TO RELATED APPLICATION

This application is based upon and claims the benefit of priority from Japanese Patent Application No. 2018-230105, filed Dec. 7, 2018, the entire contents of which are incorporated herein by reference.

FIELD

Embodiments described herein relate generally to a semiconductor storage device and a memory system.

BACKGROUND

A memory system including a NAND flash memory as a semiconductor storage device, and a memory controller that controls the NAND flash memory is known.

DESCRIPTION OF THE DRAWINGS

FIG. 9 is a table of signals for controlling registers of the semiconductor storage device according to the first embodiment.

DETAILED DESCRIPTION

Figure 1:
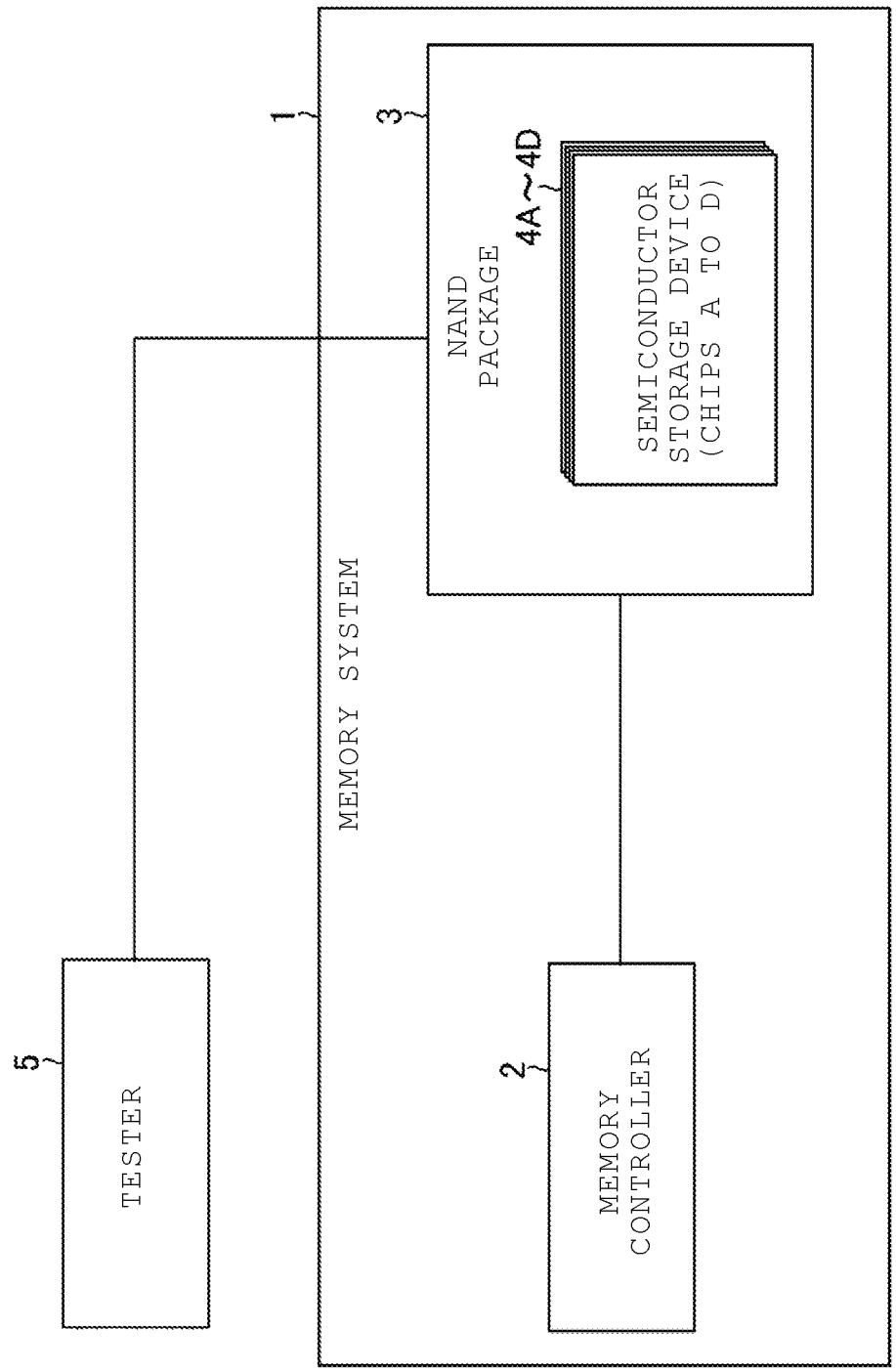
FIG. 1 is a block diagram illustrating a memory system connected to a tester.

Embodiments provide a semiconductor storage device and a memory system capable of reducing duty cycle correction time.

In general, according to one embodiment, a semiconductor storage device includes a first chip and a second chip. In response to a first command that is received on a first terminal of the first chip and a second terminal of the second chip that are connected to a command signal line, the first chip and the second chip execute in parallel a first correction process of correcting a duty cycle of a first output signal generated by the first chip and a second correction process of correcting a duty cycle of a second output signal generated by the second chip, respectively, according a common toggle signal.

Hereinafter, embodiments will be described with reference to drawings. In the following description, components having the same function and configuration are denoted by the same reference numerals.

In the following description, signals X<n:0> (n is a natural number) are signals of (n+1) bits, and means a set including signals X<0>, X<1>, . . . , and X<n>, each of which is a 1-bit signal. Further, the elements Y<n:0> means a set including elements Y<0>, Y<1>, . . . , and Y<n> corresponding one-to-one to the input or output of the signals X<n:0>.

In the following description, a signal /Z indicates that it is an inverted signal of a signal Z. Further, "duty cycle of signal Z" indicates a ratio of time a pulse is high compared to the time the pulse is low in one cycle of the pulse and "duty cycle of signal /Z" is the ratio of time a pulse is low compared to the time the pulse is high in one cycle of the pulse. The duty cycle may also be referred to as "duty ratio" or "duty factor."

1. First Embodiment

A memory system according to a first embodiment will be described. The memory system according to the first embodiment includes, for example, a NAND flash memory as a semiconductor storage device, and a memory controller that controls the NAND flash memory.

1.1 Configuration

1.1.1 Overall Configuration of Memory System

The overall configuration of the memory system according to the first embodiment will be described using FIGS. 1 and 2. A memory system 1 communicates with, for example, an external host device (not shown). The memory system 1 stores data from the host device and reads data requested by the host device.

FIG. 1 is a block diagram illustrating a memory system connected to a tester. As shown in FIG. 1, the memory system 1 includes a memory controller 2 and a NAND package 3. The NAND package 3 includes, for example, a plurality of semiconductor storage devices 4A to 4D. In the example of FIG. 1, the case where four chips are provided in the NAND package 3 is shown. In the following description, the semiconductor storage devices 4A to 4D may be referred to as chips A to D, respectively. The NAND package 3 may be also referred to as a semiconductor storage device.

A tester 5 is configured to be able to test the interface of the NAND package 3 to the memory controller 2 before shipment of the memory system 1. The tester 5 is connected to, for example, the NAND package 3 in a state before being connected to the memory controller 2, and transmits and receives a signal to and from the NAND package 3 as a pseudo memory controller 2. Thus, the tester 5 can determine whether the NAND package 3 is configured to be able to operate normally in response to an instruction from the memory controller 2. The tester 5 is removed from the memory system 1 when the memory system 1 is shipped.

Although the memory system 1 is illustrated as a configuration not including the tester 5 in the example of FIG. 1, the present disclosure is not limited thereto. For example, the memory system 1 may include the tester 5.

Figure 2:
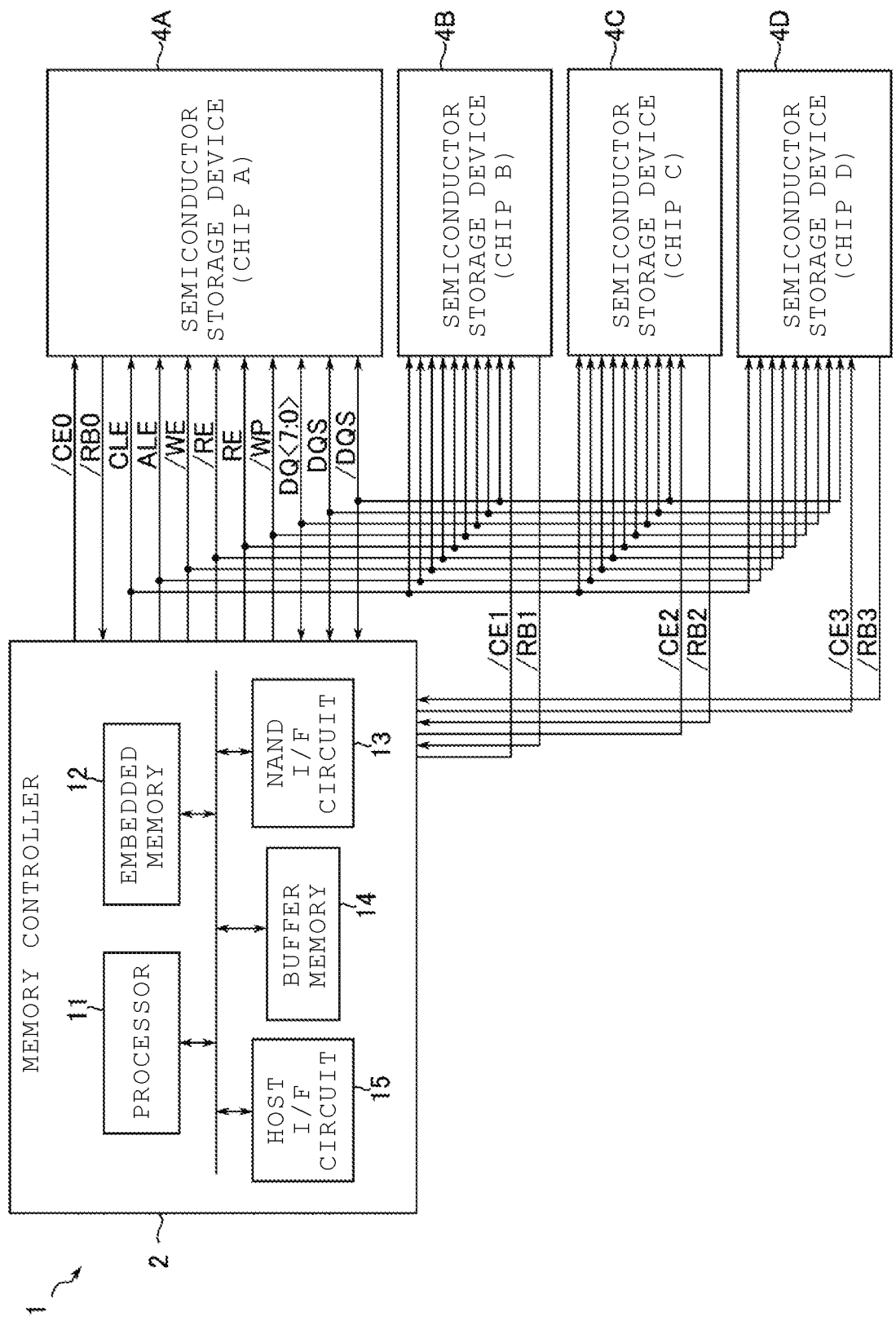
FIG. 2 is a block diagram of the memory system according to a first embodiment.

FIG. 2 is a block diagram of the memory system according to the first embodiment. As shown in FIG. 2, the memory controller 2 controls the semiconductor storage devices 4A to 4D. Specifically, the memory controller 2 writes data to the semiconductor storage devices 4A to 4D, and reads data from the semiconductor storage devices 4A to 4D. The memory controller 2 is connected to the semiconductor storage devices 4A to 4D by a NAND bus.

Each of the semiconductor storage devices 4A to 4D includes a plurality of memory cells and stores data in a non-volatile manner. Each of the semiconductor storage devices 4A to 4D is, for example, a semiconductor chip uniquely identifiable by a pre-assigned chip address, and is configured to be operable independently or in synchronization with each other according to an instruction from the memory controller 2.

The same type of signal is transmitted and received on the NAND bus connected to each of the semiconductor storage devices 4A to 4D. The NAND bus includes a plurality of signal lines, and transmits and receives signals /CE0 to /CE3, CLE, ALE, /WE, RE, /RE, /WP, /RB0 to /RB3, DQ<7:0>, DQS, and /DQS according to the NAND interface. The signals CLE, ALE, /WE, RE, /RE, and /WP are received by the semiconductor storage devices 4A to 4D, and the signals /RB0 to /RB3 are received by the memory controller 2. Also, the signals /CE0 to /CE3 are received by the semiconductor storage devices 4A to 4D, respectively.

The signals /CE0 to /CE3 are signals for enabling the semiconductor storage devices 4A to 4D, respectively. The signal CLE notifies the semiconductor storage devices 4A to 4D that the signals DQ<7:0> input into the semiconductor storage devices 4A to 4D are commands while the signal CLE is at "H (High)" level. The signal ALE notifies the semiconductor storage devices 4A to 4D that the signals DQ<7:0> input into the semiconductor storage devices 4A to 4D are addresses while the signal ALE is at "H" level. The signal /WE instructs that the signals DQ<7:0> input into the semiconductor storage devices 4A to 4D as write data while the signal /WE is at "L (Low)" level. The signals RE and /RE instruct the semiconductor storage devices 4A to 4D to output read data as the signals DQ<7:0> and are used to control the operation timing of the semiconductor storage devices 4A to 4D when they are outputting the signals DQ<7:0>. The signal /WP instructs the semiconductor storage devices 4A to 4D to prohibit data writing and erasing. The signals /RB0 to /RB3 respectively indicate whether the semiconductor storage devices 4A to 4D are in a ready state (a state in which they are capable of receiving an external command) or in a busy state (a state in which they are not capable of receiving an external command). The signals DQ<7:0> are, for example, 8-bit signals. The signals DQ<7:0> include data transmitted and received between the semiconductor storage devices 4A to 4D and the memory controller 2, and include a command, an address, and data. The signals DQS and /DQS can be generated based on, for example, the signals RE and /RE, and are used to control the operation timing of the semiconductor storage devices 4A to 4D.

1.1.2 Configuration of Memory Controller

Next, the memory controller of the memory system according to the first embodiment will be described with reference to FIG. 2. The memory controller 2 includes a processor (CPU: Central Processing Unit) 11, an embedded memory (RAM: Random Access Memory) 12, a NAND interface circuit 13 (denoted as NAND I/F circuit in FIG. 2), a buffer memory 14, and a host interface circuit 15 (denoted as host I/F circuit in FIG. 2).

The processor 11 controls the overall operation of the memory controller 2. The processor 11 issues a write instruction to the semiconductor storage devices 4A to 4D according to the NAND interface standard, in response to, e.g., a write instruction for data received from the outside. This operation is the same as in the case of other processes such as a read operation and an erase operation, and a duty cycle correction process for correcting the duty cycle of the output signal of the semiconductor storage devices 4A to 4D.

The built-in memory 12 is, for example, a semiconductor memory such as a dynamic RAM (DRAM), and is used as a work area of the processor 11. The built-in memory 12 stores firmware for managing the semiconductor storage devices 4A to 4D, various management tables, and the like.

The NAND interface circuit 13 is connected to the semiconductor storage devices 4A to 4D via the above-described NAND bus, and manages communication with the semiconductor storage devices 4A to 4D. The NAND interface circuit 13 transmits a command, an address, and write data to the semiconductor storage devices 4A to 4D according to an instruction of the processor 11. The NAND interface circuit 13 also receives status and read data from the semiconductor storage devices 4A to 4D.

The buffer memory 14 temporarily stores data and the like received by the memory controller 10 from the semiconductor storage devices 4A to 4D and the outside.

The host interface circuit 15 is connected to an external host device (not shown) and manages communication with the host device. The host interface circuit 15 transfers, for example, an instruction and data received from the host device to the processor 11 and the buffer memory 14, respectively.

1.1.3 Configuration of Semiconductor Storage Device

Next, a configuration example of the semiconductor storage device according to the first embodiment will be described with reference to FIG. 3. The semiconductor storage devices 4A to 4D have, for example, the same configuration. Therefore, in the following description, the configuration of the semiconductor storage device 4A will be described, and the description of the configuration of the semiconductor storage devices 4B to 4D is not provided.

Figure 3:
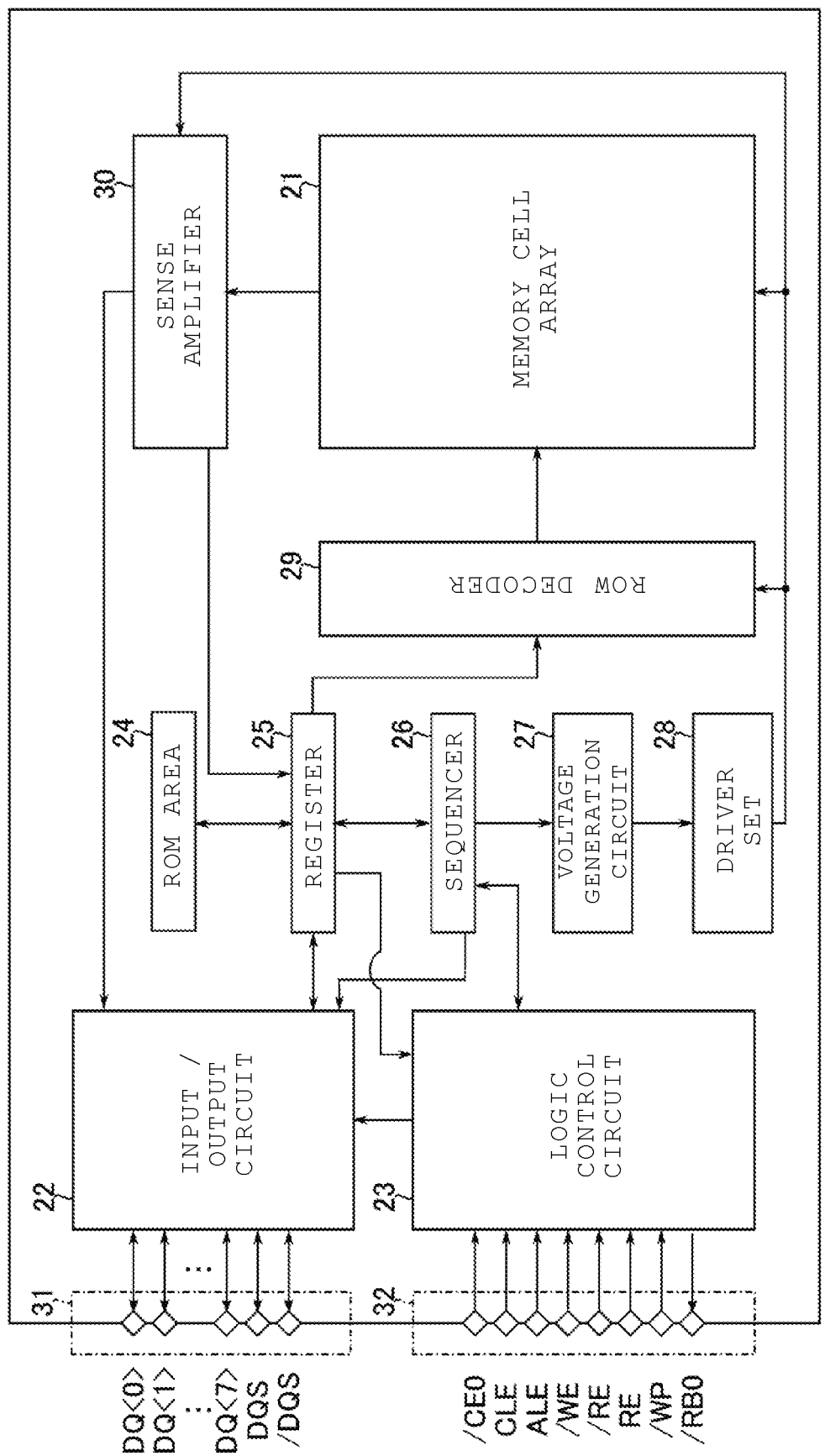
FIG. 3 is a block diagram of a semiconductor storage device according to the first embodiment.

As shown in FIG. 3, the semiconductor storage device 4A includes a memory cell array 21, an input/output circuit 22, a logic control circuit 23, a read only memory (ROM) area 24, a register 25, a sequencer 26, a voltage generation circuit 27, a driver set 28, a row decoder 29, a sense amplifier 30, an input/output pad group 31, and a logic control pad group 32.

The memory cell array 21 includes a plurality of non-volatile memory cells (not shown) associated with word lines and bit lines.

The input/output circuit 22 transmits and receives the signals DQ<7:0> to and from the memory controller 2. The input/output circuit 22 transfers the command and address in the signals DQ<7:0> to the register 25. The input/output circuit 22 transmits and receives write data and read data to and from the sense amplifier 30.

The logic control circuit 23 receives the signals /CE0, CLE, ALE, /WE, RE, /RE, and /WP from the memory controller 2. The logic control circuit 23 transfers the signal /RB0 to the memory controller 2 to notify the state of the semiconductor storage device 4A to the memory controller 2.

The ROM area 24 includes, for example, a ROM fuse, and stores initial values of setting values applied to various processes including a duty cycle correction process of the semiconductor storage device 4A in a non-volatile manner. The initial values stored in the ROM area 24 are, for example, read out when the power is turned on and stored in the register 25, and then applied to various processes.

The register 25 stores a command and an address. The register 25 transfers the address to the row decoder 29 and the sense amplifier 30, and transfers the command to the sequencer 26. Further, the register 25 temporarily stores updated values of setting values applied to various processes of the semiconductor storage device 4A. The updated values stored in the register 25 are applied to various processes, for example, after being acquired by an update process. The updated values stored in the register 25 are lost when the power is turned off.

The sequencer 26 receives the command and controls the entire semiconductor storage device 4A in accordance with the sequence based on the received command.

The voltage generation circuit 27 generates voltages necessary for a data write operation, a read operation, an erase operation, and the like based on an instruction from the sequencer 26. The voltage generation circuit 27 supplies the generated voltages to the driver set 28.

The driver set 28 includes a plurality of drivers, and supplies various voltages from the voltage generation circuit 27 to the row decoder 29 and the sense amplifier 30 based on the address from the register 25. The driver set 28 supplies various voltages to the row decoder 29 based on, for example, the row address in the address.

The row decoder 29 receives a row address in the address from the register 25 and selects a memory cell of a row based on the row address. Then, the voltage from the driver set 28 is transferred to the memory cell of the selected row via the row decoder 29.

At the time of reading data, the sense amplifier 30 senses a threshold voltage of the memory cell in the memory cell array 21 and reads the data. Then, this data is transferred to the input/output circuit 22. The sense amplifier 30 transfers write data received from the memory controller 2 to the memory cell array 21 during data writing.

The input/output pad group 31 transfers the signals DQ<7:0>, DQS, and /DQS received from memory controller 2 to the input/output circuit 22. Further, the input/output pad group 31 transfers the signals DQ<7:0> transmitted from the input/output circuit 22 to the memory controller 2.

The logic control pad group 32 transfers the signals /CE0, CLE, ALE, /WE, RE, /RE, and /WP received from the memory controller 2 to the logic control circuit 23. Further, the logic control pad group 32 transfers the signal /RB0 transmitted from the logic control circuit 23 to the memory controller 2.

1.1.5 Configuration of Input/Output Circuit and Logic Control Circuit

Next, the configuration of the input/output circuit and the logic control circuit of the semiconductor storage device according to the first embodiment will be described.

1.1.5.1 Configuration Related to Duty Cycle Correction Function

Among the input/output circuits and the logic control circuit of the semiconductor storage device according to the first embodiment, the configuration related to the function used for the duty cycle correction process will be described with reference to the block diagram shown in FIG. 4.

Figure 4:
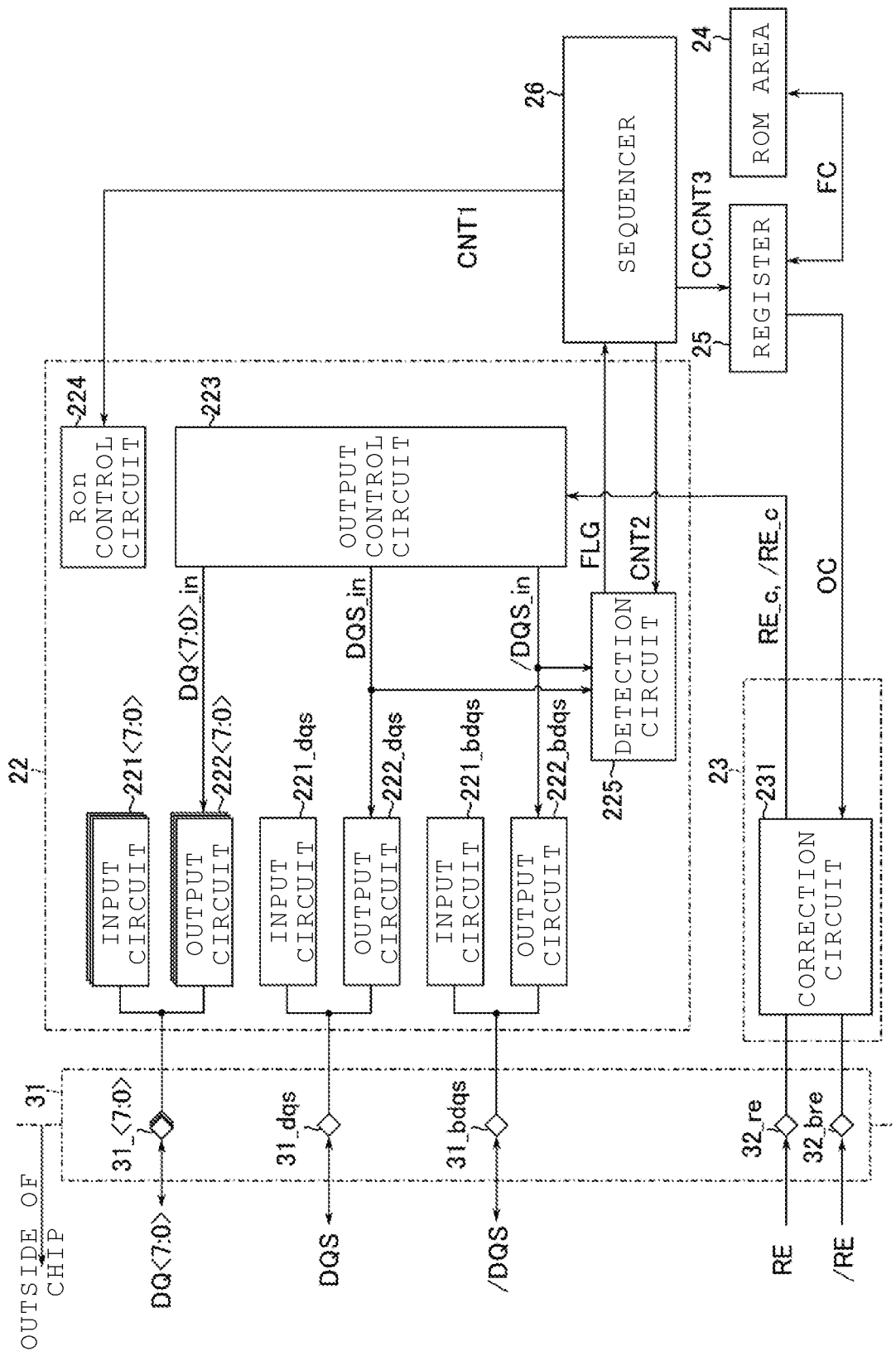
FIG. 4 is a block diagram of an input/output circuit and a logic control circuit of the semiconductor storage device according to the first embodiment.

As shown in FIG. 4, the input/output circuit 22 includes a set including input circuits 221<7:0> and output circuits 222<7:0> corresponding to the signals DQ<7:0>. For example, the same type of signal DQ<i> is assigned to one set including an input circuit 221<i> and an output circuit 222<i> (0≤i≤7). That is, the set including the input circuit 221<i> and the output circuit 222<i> can communicate a signal DQ<i> with the external memory controller 2 via a pad 31_<i> in the input/output pad group 31.

Further, the input/output circuit 22 includes a set including an input circuit 221_dqs and an output circuit 222_dqs corresponding to the signal DQS. That is, the set including the input circuit 221_dqs and the output circuit 222_dqs can communicate the signal DQS with the external memory controller 2 via a pad 31_dqs in the input/output pad group 31. Further, the input/output circuit 22 includes a set including an input circuit 221_bdqs and an output circuit 222_bdqs corresponding to the signal /DQS. That is, the set including the input circuit 221_bdqs and the output circuit 222_bdqs can communicate the signal /DQS with the external memory controller 2 via a pad 31_bdqs in the input/output pad group 31.

The input/output circuit 22 further includes an output control circuit 223, a Ron control circuit 224, and a detection circuit 225.

The output control circuit 223 generates signals DQ<7:0>_in, DQS_in, and /DQS_in from which the signals DQ<7:0>, DQS, and /DQS are derived, and sends the signals to the output circuits 222<7:0>, 222_dqs, and 222_bdqs, respectively.

The Ron control circuit 224 controls an output impedance in the output circuits 222<7:0>, 222_dqs, and 222_bdqs based on a control signal CNT1 sent from the sequencer 26.

The detection circuit 225 monitors the signals DQS_in and /DQS_in sent from the output control circuit 223 based on a control signal CNT2 sent from the sequencer 26, and detects the duty cycle of the signals DQS_in and /DQS_in. The detection circuit 225 generates a signal FLG indicating whether or not a duty cycle correction process is necessary based on the detection result of the duty cycle, and sends the signal FLG to the sequencer 26.

When receiving the signal FLG from the detection circuit 225, the sequencer 26 generates a signal CC including a duty cycle correction result based on the signal FLG. The sequencer 26 sends the signal CC to the register together with a control signal CNT3 to control the correction value of the duty cycle applied during various operations.

The ROM area 24 is configured to be able to receive a signal FC from the register 25 in order to store the result of the duty cycle correction process as an initial value before shipment. The ROM area 24 sends the signal FC corresponding to the initial value to the register 25 in response to the control signal CNT3.

When receiving the signal FC from the ROM area 24 and the signal CC and the control signal CNT3 from the sequencer 26, the register 25 determines which of the signals FC and CC is to be sent to the logic control circuit 23 based on the control signal CNT3. The register 25 sends the signal determined to be sent to the logic control circuit 23 as a signal OC.

The logic control circuit 23 includes a correction circuit 231. The correction circuit 231 has a function of correcting the duty cycle of the signals RE and /RE input via pads 32_re and 32_bre in the logic control pad group 32, respectively. The correction circuit 231 corrects the duty cycle of the signals RE and /RE based on the signal OC from the sequencer 26 to generate signals RE_c and /RE_c. The signals RE_c and /RE_c are sent to, for example, the output control circuit 223, and are used as a basis for the toggle timing of the signals DQS and /DQS to be generated in the output control circuit 223. More specifically, the duty cycle of the signals DQS and /DQS is determined in accordance with the duty cycle of the signals RE_c and /RE_c. For example, the duty cycle of the signals DQS and /DQS and the duty cycle of the signals RE_c and /RE_c are identical or they are correlated with each other.

In the example of FIG. 4, although the case where the signals RE_c and /RE_c are directly sent from the correction circuit 231 to the output control circuit 223 is shown, the present disclosure is not limited thereto. For example, the correction circuit 231 may send the signals RE_c and /RE_c to another circuit (for example, the sequencer 26), and a timing signal based on the duty cycle of the signals RE_c and /RE_c may be generated in the other circuit. Then, when the timing signal is sent to the output control circuit 223, the signals DQS_in and /DQS_in having a correlation with the duty cycle of the signals RE_c and /RE_c may be generated.

With the above configuration, the detection circuit 225 detects that the duty cycle of the signals DQS_in and /DQS_in deviates from a desired value, and the duty cycle of the signals RE and /RE can be corrected by the correction circuit 231 based on the detection result. Then, the correction result is fed back to the output control circuit 223, whereby the duty cycle of the signals DQS_in and /DQS_in is corrected, and consequently, the signals DQS and /DQS having the desired duty cycle can be output.

1.1.5.2 Configuration of Correction Circuit

Figure 5:
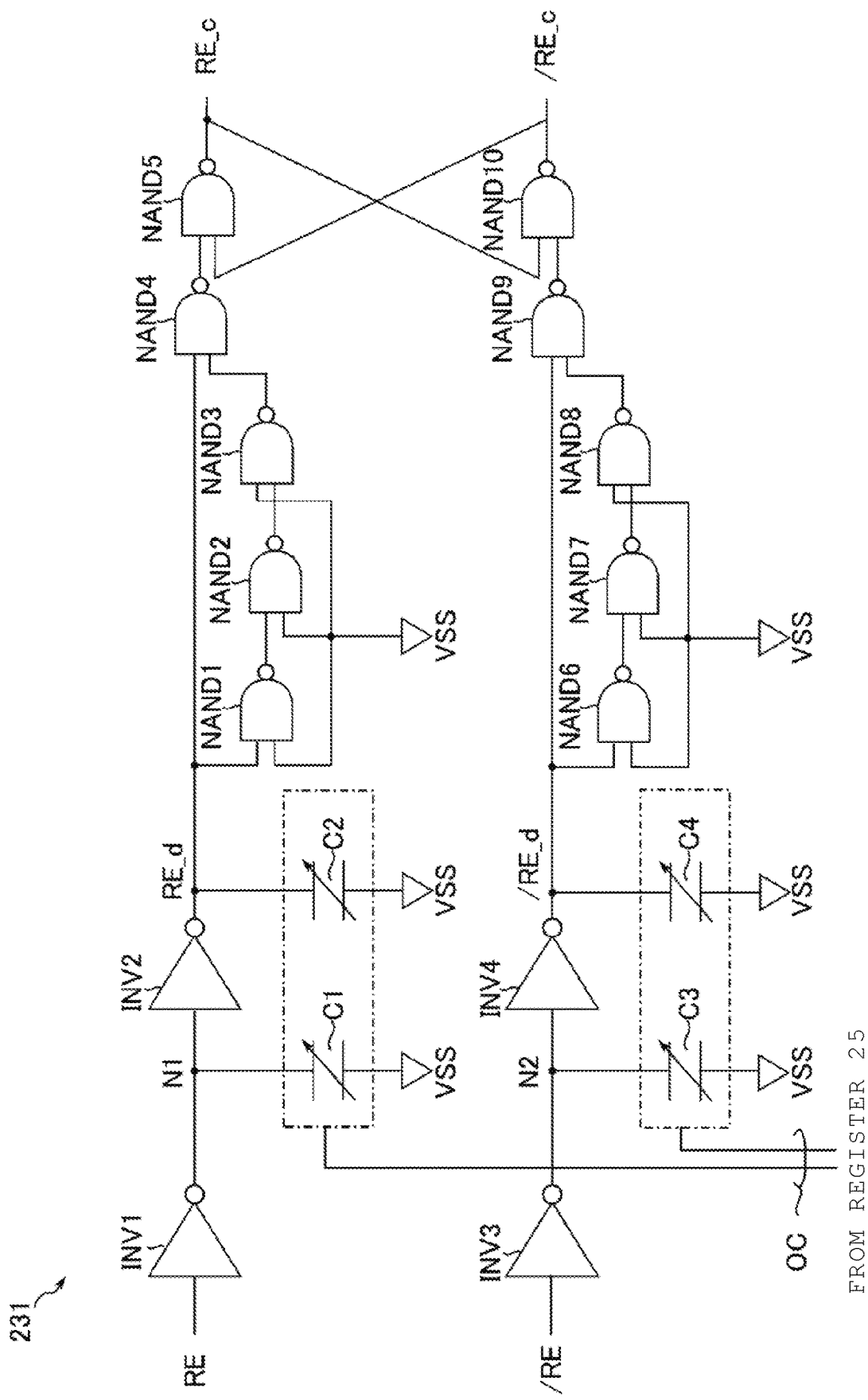
FIG. 5 is a circuit diagram of a correction circuit of the semiconductor storage device according to the first embodiment.

Among the input/output circuits according to the first embodiment, the configuration of the correction circuit will be described with reference to FIG. 5. FIG. 5 is a circuit diagram of a correction circuit of the semiconductor storage device according to the first embodiment.

As shown in FIG. 5, the correction circuit 231 includes inverters INV1, INV2, INV3, and INV4, variable capacitors C1, C2, C3, and C4, and logic circuits NAND1, NAND2, NAND3, NAND4, NAND5, NAND6, NAND7, NAND8, NAND9, and NAND10.

The inverter INV1 includes an input end to which the signal RE is input, and an output end connected to a node N1. The inverter INV2 includes an input end connected to the node N1 and an output end connected to a node RE_d.

The variable capacitor C1 includes a first end connected to the node N1 and a second end to which a voltage VSS is supplied. Variable capacitor C2 includes a first end connected to the node RE_d, and a second end to which the voltage VSS is supplied.

The inverter INV3 includes an input end to which signal /RE is input, and an output end connected to a node N2. The inverter INV4 includes an input end connected to the node N2, and an output end connected to the node /RE_d.

The variable capacitor C3 includes a first end connected to the node N2, and a second end to which the voltage VSS is supplied. The variable capacitor C4 includes a first end connected to the node /RE_d, and a second end to which the voltage VSS is supplied.

The variable capacitors C1 to C4 are configured to be able to change the capacitances thereof based on the signal OC sent from the register 25. More specifically, for example, each of the variable capacitors C1 to C4 includes a plurality of sets of capacitors and switches (not shown) connected in series, and may include a plurality of sets connected in parallel. The signal OC is, for example, a signal that includes DAC values of multiple bits and can set any number of switches in the variable capacitors C1 to C4 to be in an on state or an off state. By configuring as described above, the variable capacitors C1 to C4 can switch the size of the capacitance stepwise in a certain range according to the signal OC. That is, signals delayed by a certain amount are supplied to the nodes RE_d and /RE_d in accordance with the capacitances set in the variable capacitors C1 to C4.

The delay amount from the signal RE at the node RE_d and the delay amount from the signal /RE at the node /RE_d are configured to be controllable independently of each other. Therefore, according to the signal OC, the nodes RE_d and /RE_d can be supplied with signals delayed with respect to one another by a variable amount of time.

The logic circuits NAND1 to NAND10 output a NAND operation result of two input signals.

The logic circuit NAND1 includes a first input end connected to the node RE_d, a second input end to which the voltage VSS is supplied, and an output end connected to a first input end of the logic circuit NAND2. The logic circuit NAND2 includes a second input end to which the voltage VSS is supplied, and an output end connected to a first input end of the logic circuit NAND3. The logic circuit NAND3 includes a second input end to which the voltage VSS is supplied, and an output end connected to a first input end of the logic circuit NAND4. The logic circuit NAND4 includes a second input end connected to the node RE_d, and an output end connected to a first input end of the logic circuit NAND5. The logic circuit NAND5 includes a second input end connected to a node /RE_c, and an output end connected to a node RE_c.

The logic circuit NAND6 includes a first input end connected to the node /RE_d, a second input end to which the voltage VSS is supplied, and an output end connected to a first input end of the logic circuit NAND7. The logic circuit NAND7 includes a second input end to which the voltage VSS is supplied, and an output end connected to a first input end of the logic circuit NAND8. The logic circuit NAND8 includes a second input end to which the voltage VSS is supplied, and an output end connected to a first input end of the logic circuit NAND9. The logic circuit NAND9 includes a second input end connected to the node /RE_d, and an output end connected to a first input end of the logic circuit NAND10. The logic circuit NAND10 includes a second input end connected to the node RE_c, and an output end connected to the node /RE_c.

The logic circuits NAND5 and NAND10 form a reset/set (RS) flip flop circuit. Thus, the voltage level of the node RE_c changes from "L" level to "H" level or "H" level to "L" level at the timing when voltage levels of nodes RE_d and /RE_d change from "L" level to "H" level. That is, the node RE_c outputs a signal whose voltage level changes according to the rising (rising edge) of the pulse of the nodes RE_d and /RE_d. Further, as the voltage level of the node /RE_c, an inverted signal of the node RE_c is output.

1.1.5.3 Configuration of Output Circuit

Figure 6:
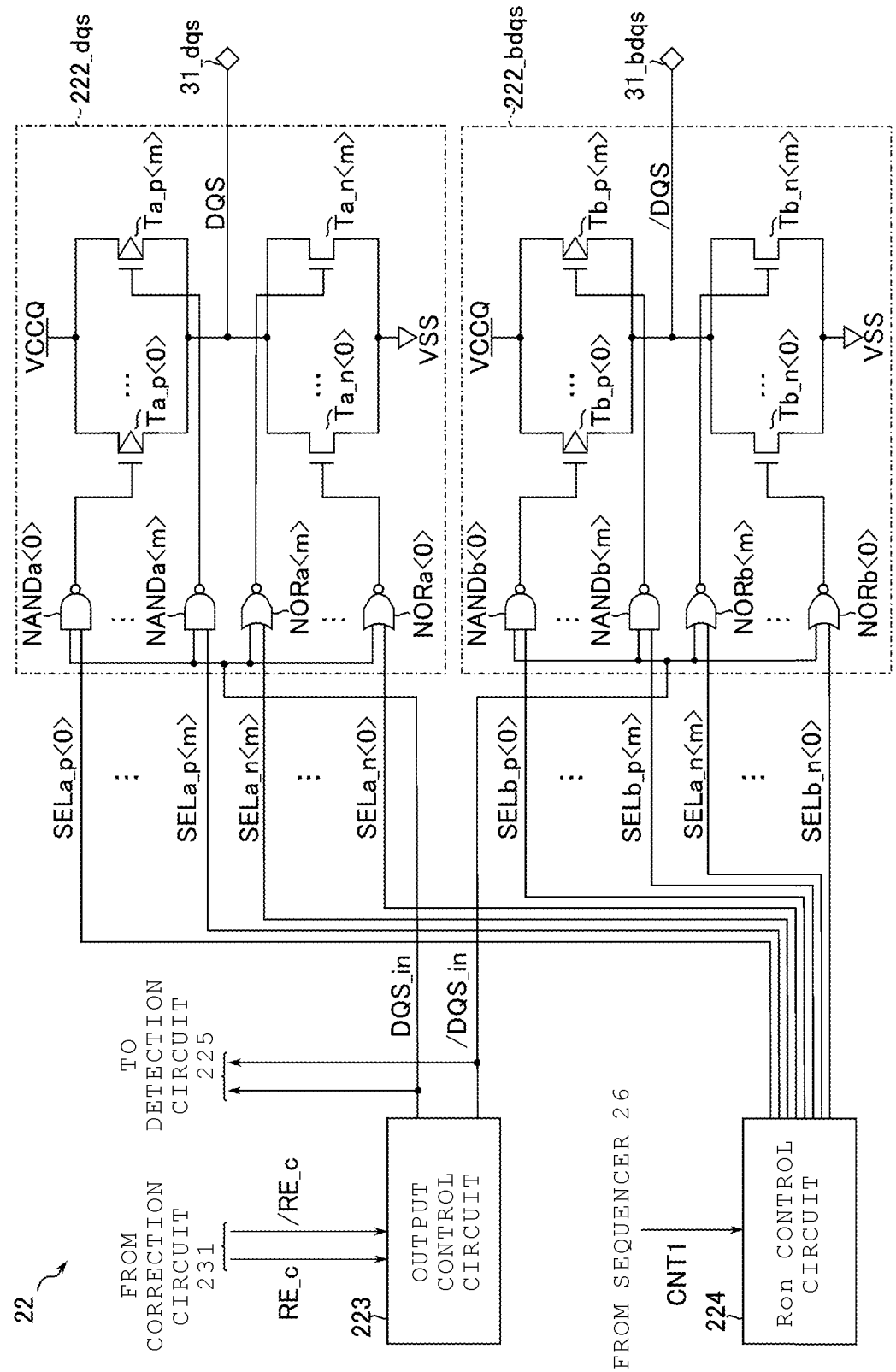
FIG. 6 is a circuit diagram of an output circuit of the semiconductor storage device according to the first embodiment.

Next, among the input/output circuits according to the first embodiment, the configuration of the output circuit will be described with reference to FIG. 6. FIG. 6 is a circuit diagram of an output circuit of the semiconductor storage device according to the first embodiment. FIG. 6 shows an example of the connection relationship between the output circuits 222_dqs and 222_bdqs, and the output control circuit 223, the Ron control circuit 224, the pads 31_dqs and 31_bdqs.

As shown in FIG. 6, the output circuit 222_dqs includes logic circuits NANDa<m:0> and NORa<m:0>, and transistors Ta_p<m:0> and Ta_n<m:0>. The output circuit 222_bdqs also includes logic circuits NANDb<m:0> and NORb<m:0>, and transistors Tb_p<m:0> and Tb_n<m:0>. Here, m is any natural number.

The logic circuits NANDa<m:0> and NANDb<m:0> output the result of the NAND operation of two input signals. The logic circuits NORa<m:0> and NORb<m:0> output the NOR operation result of two input signals. The transistors Ta_p<m:0> and Tb_p<m:0> have p-type polarity, and the transistors Ta_n<m:0> and Tb_n<m:0> have n-type polarity.

As described above, the output control circuit 223 sends out the signals DQS_in and /DQS_in generated based on the duty cycle of the signals sent from the nodes RE_c and /RE_c of the correction circuit 231. The Ron control circuit 224 also sends out signals SELa_p<m:0> and SELa_n<m:0> and signals SELb_p<m:0> and SELb_n<m:0>.

First, the configuration of the output circuit 222_dqs will be described.

The logic circuits NANDa<m:0> include a first input end to which the signal DQS_in is commonly supplied, and include a second input end to which the signal SELa_p<m:0> are respectively supplied. The outputs of the logic circuits NANDa<m:0> are connected to the gates of the transistors Ta_p<m:0>, respectively.

The transistors Ta_p<m:0> include a first end to which a voltage VCCQ is commonly supplied, and a second end commonly connected to the pad 31_dqs.

The logic circuits NORa<m:0> include a first input end to which the signal DQS_in is commonly supplied, and include a second input end to which the signals SELa_n<m:0> are respectively supplied. The outputs of the logic circuits NORa<m:0> are connected to the gates of the transistors Ta_n<m:0>, respectively.

The transistors Ta_n<m:0> include a first end to which the voltage VSS is commonly supplied, and a second end commonly connected to the pad 31_dqs.

By configuring as described above, when the output circuit 222_dqs outputs the signal DQS_in at "H" level, the output circuit 222_dqs can set the combined resistance of the transistors selected among the transistors Ta_p<m:0> to be on-resistance by the signals SELa_p<m:0>, as the output impedance on the pull-up side of the signal DQS. In a case where the signal DQS_in is at "L" level, the output circuit 222_dqs can set the combined resistance of the transistors selected among the transistors Ta_n<m:0> to be on-resistance by the signals SELa_n<m:0>, as the output impedance on the pull-down side of the signal DQS.

Next, the configuration of the output circuit 222_bdqs will be described.

The logic circuits NANDb<m:0> include a first input end to which the signal /DQS_in is commonly supplied, and include a second input end to which the signals SELb_p<m:0> are respectively supplied. The outputs of the logic circuits NANDb<m:0> are connected to the gates of the transistors Tb_p<m:0>, respectively.

The transistors Tb_p<m:0> include a first end to which the voltage VCCQ is commonly supplied, and a second end commonly connected to a pad 32_bdqs.

The logic circuits NORb<m:0> include a first input end to which the signal /DQS_in is commonly supplied, and a second input end to which the signals SELb_n<m:0> is respectively supplied. The outputs of the logic circuits NORb<m:0> are connected to the gates of the transistors Tb_n<m:0>, respectively.

The transistors Tb_n<m:0> include a first end to which the voltage VSS is commonly supplied, and a second end commonly connected to the pad 31_bdqs.

By configuring as described above, when the output circuit 222_bdqs outputs the signal /DQS_in at "H" level, the output circuit 222_bdqs can set the combined resistance of the transistors selected among the transistors Tb_p<m:0> to be on-resistance by the signals SELb_p<m:0>, as the output impedance on the pull-up side of the signal /DQS. When the signal /DQS_in is at "L" level, the output circuit 222_bdqs can set the combined resistance of the transistors selected among the transistors Tb_n<m:0> to be on-resistance by the signals SELb_n<m:0>, as the output impedance on the pull-down side of the signal /DQS.

As described above, the output circuits 222_dqs and 222_bdqs generate the signals DQS and /DQS based on the signals DQS_in and /DQS_in. Therefore, when the duty cycle of the signals DQS_in and /DQS_in is not set appropriately, the duty cycle of the signals DQS and /DQS may not be set appropriately. Therefore, the detection circuit 225 monitors the signals DQS_in and /DQS_in to detect whether the duty cycle of the signals DQS_in and /DQS_in is set appropriately.

1.1.5.4 Configuration of Detection Circuit

Figure 7:
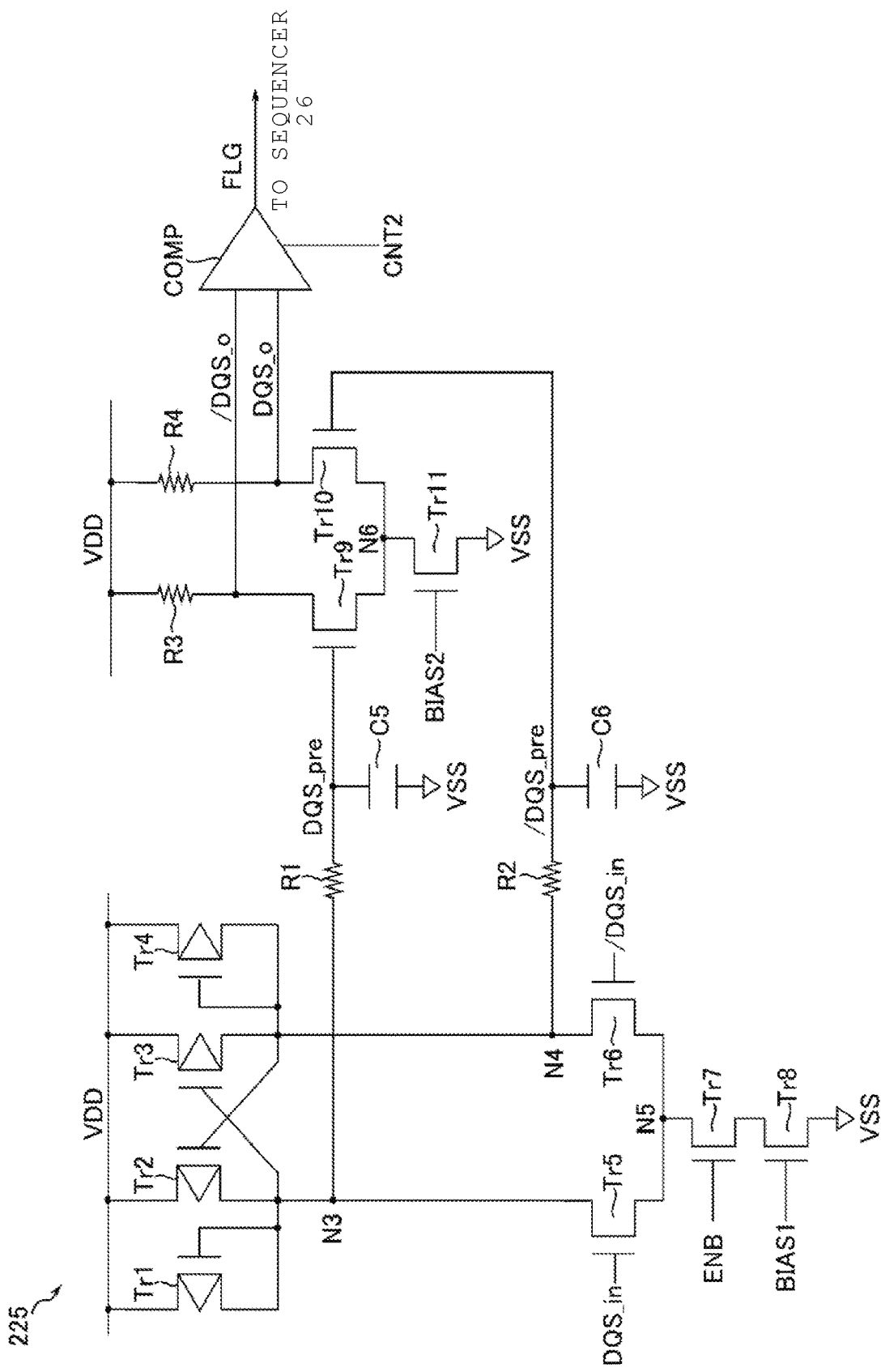
FIG. 7 is a circuit diagram of a detection circuit of the semiconductor storage device according to the first embodiment.

Next, among the input/output circuits according to the first embodiment, the configuration of the detection circuit will be described with reference to FIG. 7. FIG. 7 is a circuit diagram of a detection circuit of the semiconductor storage device according to the first embodiment.

As shown in FIG. 7, the detection circuit 225 includes transistors Tr1, Tr2, Tr3, Tr4, Tr5, Tr6, Tr7, Tr8, Tr9, Tr10, and Tr11, resistors R1, R2, R3, and R4, capacitors C5 and C6, and a comparator COMP. The transistors Tr1 to Tr4 have, for example, p-type polarity, and the transistors Tr5 to Tr11 have, for example, n-type polarity.

The transistor Tr1 includes a first end to which a voltage VDD is supplied, and a second end and a gate connected to a node N3. The voltage VDD is a power supply having a predetermined value, and has a voltage level (at "H" level) that can turn on the transistors Tr1 to Tr11. Also, a voltage VDD/2 has a voltage level (at "L" level) that can turn off the transistors Tr1 to Tr11. The transistor Tr2 includes a first end to which the voltage VDD is supplied, a second end connected to the node N3, and a gate connected to a node N4. The transistor Tr3 includes a first end to which the voltage VDD is supplied, a second end connected to the node N4, and a gate connected to the node N3. The transistor Tr4 includes a first end to which the voltage VDD is supplied, and a second end and a gate connected to the node N4.

The transistor Tr5 includes a first end connected to the node N3, a second end connected to a node N5, and a gate to which the signal DQS_in is supplied. The transistor Tr6 includes a first end connected to the node N4, a second end connected to the node N5, and a gate to which the signal /DQS_in is supplied. The transistor Tr7 includes a first end connected to the node N5, a second end connected to a first end of the transistor Tr8, and a gate to which a signal ENB is supplied. The transistor Tr8 includes a second end to which the voltage VSS is supplied, and a gate to which a signal BIAS1 is supplied.

The resistor R1 includes a first end connected to the node N3, and a second end connected to a node DQS_pre. The capacitor C5 includes a first end connected to the node DQS_pre, and a second end to which the voltage VSS is supplied.

The resistor R2 includes a first end connected to the node N4, and a second end connected to a node /DQS_pre. The capacitor C6 includes a first end connected to the node /DQS_pre, and a second end to which the voltage VSS is supplied.

With the above configuration, the voltages of the nodes DQS_pre and /DQS_pre can be set to "H" level or "L" level according to the duty cycle of the signals DQS_in and /DQS_in. Specifically, in a case where the duty cycle of the signals DQS_in and /DQS_in is larger than 50%, the nodes DQS_pre and /DQS_pre are at "H" level and "L" level, respectively. When the duty cycle of the signals DQS_in and /DQS_in is smaller than 50%, the nodes DQS_pre and /DQS_pre are at "L" level and "H" level, respectively.

The resistor R3 includes a first end to which the voltage VDD is supplied, and a second end connected to a node /DQS_o. The transistor Tr9 includes a first end connected to the node /DQS_o, a second end connected to a node N6, and a gate connected to the node DQS_pre.

The resistor R4 includes a first end to which the voltage VDD is supplied, and a second end connected to the node DQS_o. The transistor Tr10 includes a first end connected to the node DQS_o, a second end connected to the node N6, and a gate connected to the node /DQS_pre.

The transistor Tr11 includes a first end connected to the node N6, a second end to which the voltage VSS is supplied, and a gate to which a signal BIAS2 is supplied.

With the above configuration, the voltage levels of the nodes DQS_o and /DQS_o can be set according to the voltage levels supplied to the nodes DQS_pre and /DQS_pre. That is, when "H" level and "L" level are supplied to the nodes DQS_pre and /DQS_pre, respectively, "H" level and "L" level are supplied to the nodes DQS_o and /DQS_o, respectively. Further, when "L" level and "H" level are supplied to the nodes DQS_pre and /DQS_pre, respectively, "L" level and "H" level are supplied to the nodes DQS_o and /DQS_o, respectively.

The comparator COMP includes a first input end to which the node DQS_o is connected, a second input end to which the node /DQS_o is connected, and an output end for outputting the signal FLG. The comparator COMP is driven by the voltage supplied from the control signal CNT2. The comparator COMP switches the voltage level of the signal FLG to "H" level or "L" level according to the magnitude relationship between the voltage levels of the nodes DQS_o and /DQS_o. Specifically, when the nodes DQS_o and /DQS_o are at "H" level and "L" level, respectively, the comparator COMP outputs the signal FLG at "H" level. Further, the comparator COMP outputs the signal FLG at "L" level when the nodes DQS_o and /DQS_o are at "L" level and "H" level, respectively.

With the above configuration, when the duty cycle of the signals DQS_in and /DQS_in is larger than 50%, the detection circuit 225 can output the signal FLG at "H" level and output the signal FLG at "L" level when the duty cycle of the signals DQS_in and /DQS_in is smaller than 50%.

1.1.6 Configuration of Register and ROM Area

Next, the configuration of a register and a ROM area of the semiconductor storage device according to the first embodiment will be described. The correction amount of duty cycle includes, for example, a multi-bit DAC value (for example, 8 bits). In the following description, a signal including the multi-bit DAC value is also generically referred to as "code".

Figure 8:
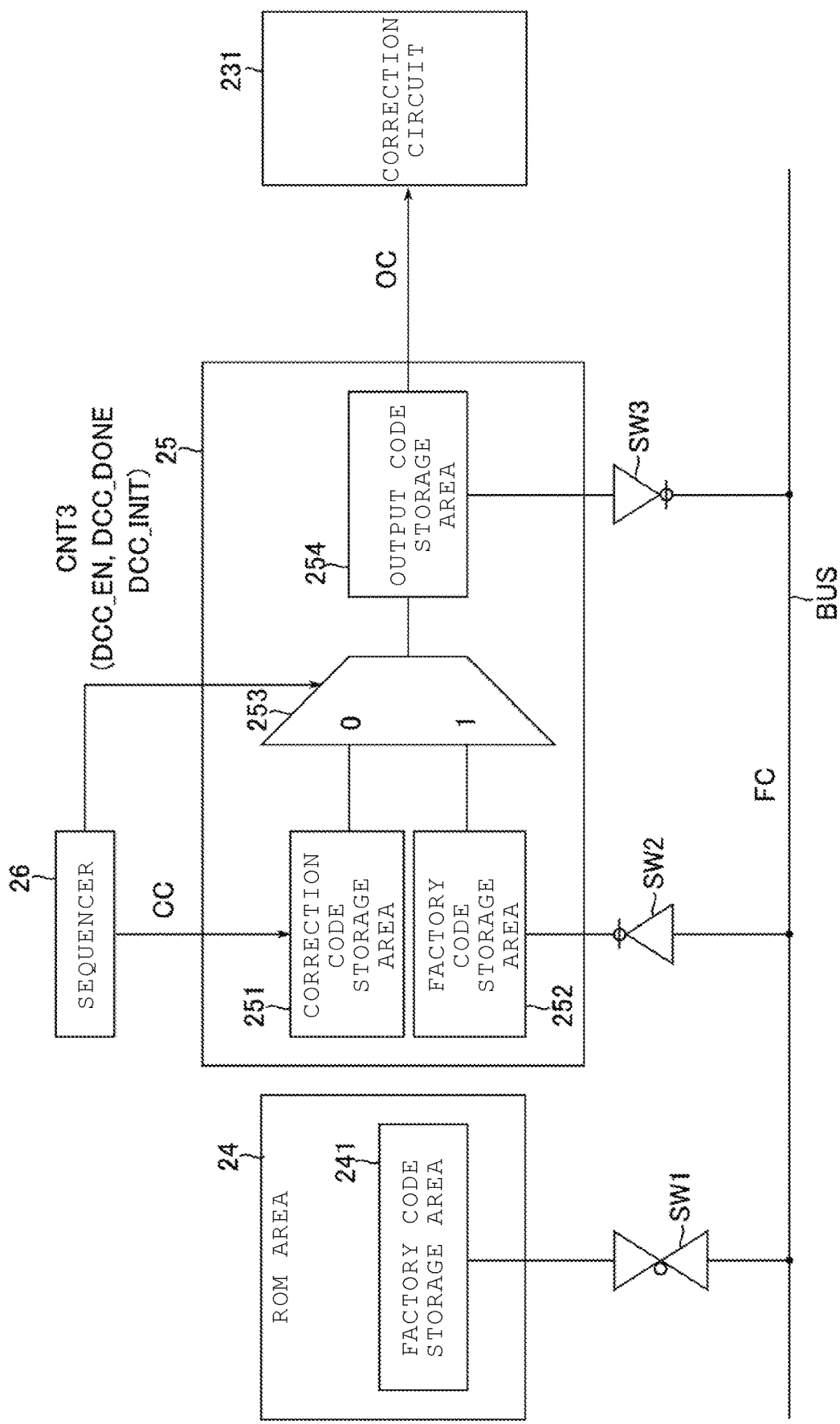
FIG. 8 is a block diagram of a register and a ROM area of the semiconductor storage device according to the first embodiment.

FIG. 8 is a block diagram of the register and the ROM area of the semiconductor storage device according to the first embodiment. In FIG. 8, the transmission/reception path between the ROM area 24, the register 25, and the sequencer 26, and the output path to the correction circuit 231 are mainly shown for the duty cycle correction result.

As shown in FIG. 8, the ROM area 24 includes a factory code storage area 241. The factory code storage area 241 is, for example, a ROM fuse, and is an area in which the result of the duty cycle correction process executed before shipment of the memory system 1 is stored as a "factory code" in a non-rewritable state in a non-volatile manner.

The register 25 includes a correction code storage area 251, a factory code storage area 252, a multiplexer 253, and an output code storage area 254.

The correction code storage area 251 is an area in which the signal CC calculated by the sequencer 26 based on the signal FLG is stored as a "correction code" in a volatile manner so as to be rewritable in the duty cycle correction process. The correction code stored in the correction code storage area 251 may include any interim value calculated during the duty cycle correction process and the final value calculated by the duty cycle correction process.

The factory code storage area 252 is an area for temporarily (in a volatile manner) storing the factory code stored in the factory code storage area 241.

The multiplexer 253 incudes a first input terminal to which the correction code stored in the correction code storage area 251 is input, a second input terminal to which the factory code stored in the factory code storage area 252 is input, a control terminal to which the control signal CNT3 output from the sequencer 26 is input, and an output terminal for outputting either the correction code or the factory code to the output code storage area 254. The first input terminal and the second input terminal are, for example, associated with control values 0 and "1", respectively. The multiplexer 253 is configured to select one of the control values "0" and "1" based on the control signal CNT3 and to output an input corresponding to the selected one of the control values from the output terminal. The control signal CNT3 includes, for example, control signals DCC_EN, DCC_DONE, and DCC_INIT. Details of the correspondence relationship between the control signal CNT3 and the control value will be described later.

The output code storage area 254 is an area for temporarily (in a volatile manner) storing the correction code or the factory code output from the multiplexer 253 as an "output code". The output code stored in the output code storage area 254 is output to the correction circuit 231 as a signal OC.

The ROM area 24 and the register 25 are configured to be able to transmit and receive the signal FC indicating the factory code via a bus BUS. More specifically, the bus BUS is connected to the factory code storage area 241 via a switch SW1, connected to a factory code storage area 242 via a switch SW2, and connected to the output code storage area 254 via a switch SW3.

The switch SW1 is a switch configured to be able to communicate the signal FC in both directions. The switch SW2 is a switch configured to be able to communicate the signal FC in the direction from the bus BUS toward the factory code storage area 252. The switch SW3 is another switch configured to be able to communicate the signal FC in the direction from the output code storage area 254 toward the bus BUS.

With the above configuration, the correction circuit 231 can selectively receive either the correction code or the factory code. In addition, the ROM area 24 and the register 25 can transmit and receive the factory code to each other.

FIG. 9 is a table for showing details of signals for controlling multiplexers in the register of the semiconductor storage device according to the first embodiment.

As shown in FIG. 9, the multiplexer 253 is configured to select one of the control value "1" and "0" by a combination of the control signals DCC_EN, DCC_DONE, and DCC_INIT, each of which can take a logic value of either "L" level or "H" level.

For example, the control signal DCC_EN is at "H" level when the duty cycle correction process is being executed, and is at "L" level when the duty cycle correction process is not being executed. The control signal DCC_DONE is, for example, at "H" level when a valid value (signal CC) is stored in the correction code storage area 251, and is at "L" level when an invalid value is stored (signal CC is not stored). The control signal DCC_INIT is, for example, at "H" level when a special process of forcibly storing the factory code in the output code storage area 254 is executed, and is at "L" level when the special process is not executed.

When the control signals DCC_EN, DCC_DONE, and DCC_INIT are all at "L" level, the multiplexer 253 selects the control value "1". Thus, the multiplexer 253 outputs the factory code input from the factory code storage area 252 to the output code storage area 254. The case is selected when the correction code is invalid, for example, immediately after the memory system 1 is powered on.

When the set including the control signals DCC_EN, DCC_DONE, and DCC_INIT is at "L" level, "H" level, and "L" level, the multiplexer 253 selects the control value "0". Thus, the multiplexer 253 outputs the correction code input from the correction code storage area 251 to the output code storage area 254. The case is selected when the correction code is valid, for example, after executing the duty cycle correction process.

When the set including the control signals DCC_EN, DCC_DONE, and DCC_INIT is at "H" level, "L" level, and "L" level, or at "H" level, "H" level, and "L" level, the multiplexer 253 selects the control value "0". Thus, the multiplexer 253 outputs the correction code input from the correction code storage area 251 to the output code storage area 254. The case is selected, for example, when the duty cycle correction process is being executed.

When the control signal DCC_INIT is at the "H" level, the multiplexer 253 selects the control value "1". Thus, the multiplexer 253 outputs the factory code input from the factory code storage area 252 to the output code storage area 254. The case is selected, for example, in the case of executing a special process of forcibly storing the factory code as described above.

With the above configuration, the sequencer 26 can appropriately select either the factory code or the correction code and send the selected one to the correction circuit 231 by sending the control signal CNT3 according to the situation to the register 25.

1.2 Operation

Next, the operation of the memory system according to the first embodiment will be described.

1.2.1 Test Phase

First, an operation in a test phase corresponding to the memory system 1 before shipment will be described. In the test phase, the semiconductor storage devices 4A to 4D are in a state before being packaged (for example, the state of a wafer), and the tester 5 determines whether or not communication with the memory controller 2 can be normally executed. In the following description, in the test phase, each of the semiconductor storage devices 4A to 4D is connected to the tester 5 via the NAND interface.

1.2.1.1 Overview

Figure 10:
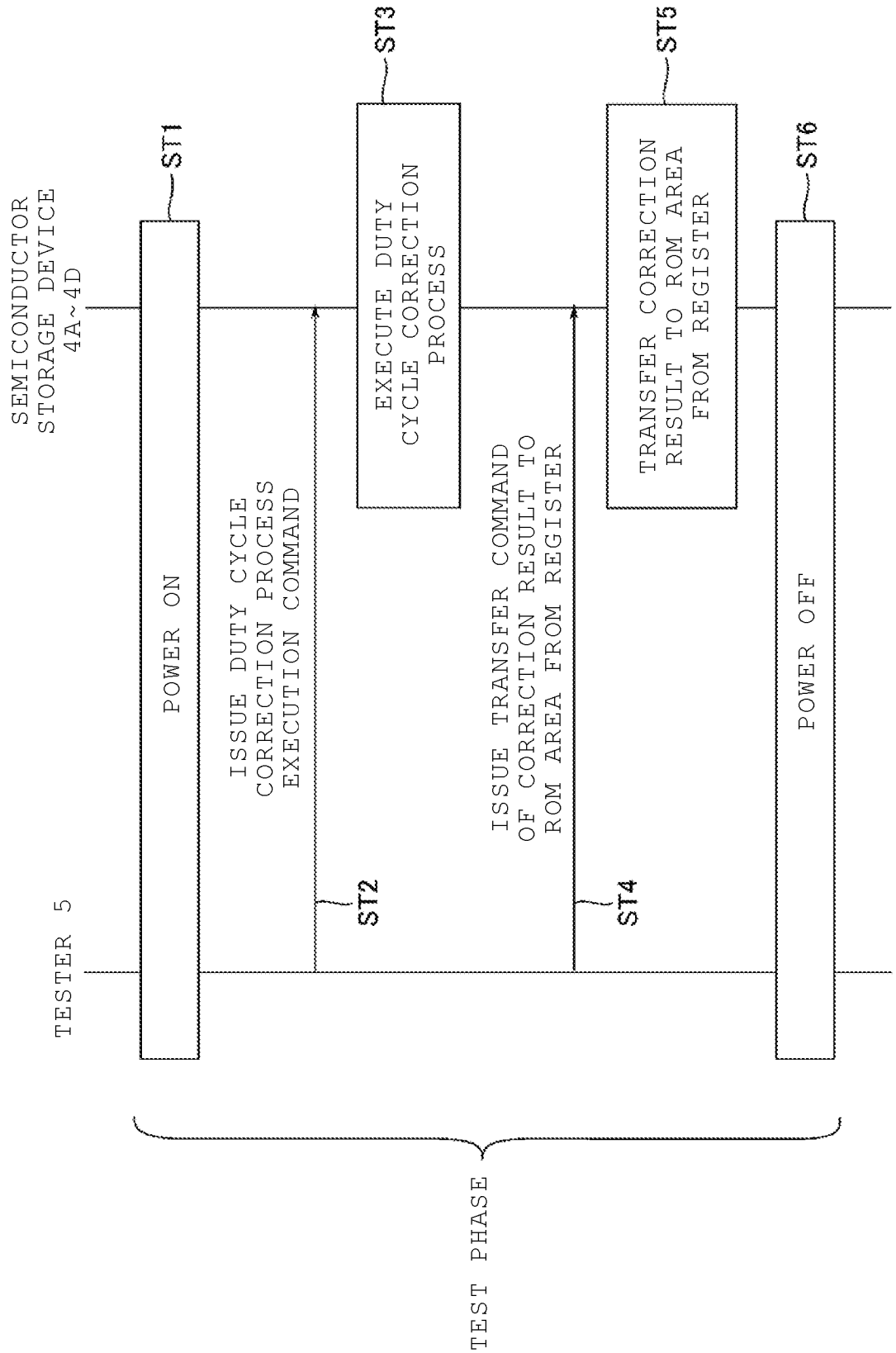
FIG. 10 is a flowchart of a duty cycle correction process and a correction result transfer process in a test phase of the memory system according to the first embodiment.

FIG. 10 is a flowchart for showing a duty cycle correction process and a correction result transfer process in a test phase of the semiconductor storage device according to the first embodiment.

As shown in FIG. 10, in step ST1, the tester 5 and the semiconductor storage devices 4A to 4D are powered on. In this way, the test phase starts.

In step ST2, the tester 5 issues a command (duty cycle correction process execution command) for executing the duty cycle correction process, and sends the command to the semiconductor storage devices 4A to 4D.

In step ST3, each of the semiconductor storage devices 4A to 4D executes a duty cycle correction process upon receiving the duty cycle correction process execution command. Thereby, each of the semiconductor storage devices 4A to 4D can store the result of the duty cycle correction process in the internal register 25.

In step ST4, the tester 5 issues a command (transfer command) to transfer the result of the duty cycle correction process executed in step ST3 from the internal register 25 to the ROM area 24, to each of the semiconductor storage devices 4A to 4D.

In step ST5, when receiving the transfer command, each of the semiconductor storage devices 4A to 4D executes the transfer process of the correction result from internal register 25 to the ROM area 24. As a result, the result of the duty cycle correction process stored in the register 25 is stored in the ROM area 24 in a non-volatile manner.

In step ST6, the tester 5 and the semiconductor storage devices 4A to 4D are powered off. In this way, the test phase is completed.

Figure 11:
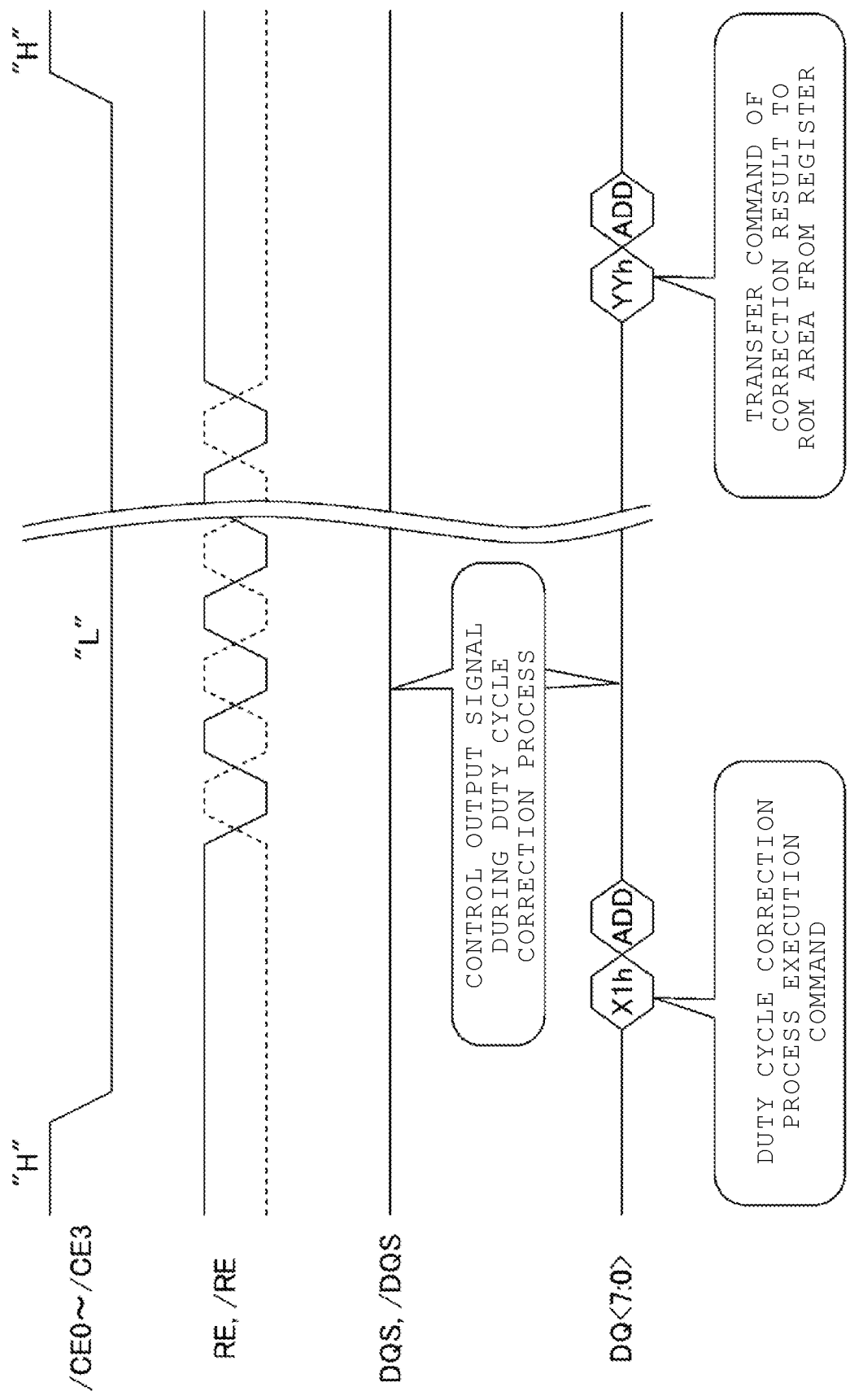
FIG. 11 is a command sequence for the duty cycle correction process and the correction result transfer process in the test phase of the memory system according to the first embodiment.

FIG. 11 is a command sequence for showing the duty cycle correction process and correction result transfer process in the test phase of the semiconductor storage device according to the first embodiment.

As shown in FIG. 11, the tester 5 sets the signals /CE0 to /CE3 to "L" level to enable all the semiconductor storage devices 4A to 4D.

The tester 5 successively issues a duty cycle correction process execution command "X1h" and an address ADD.

Subsequently, the tester 5 toggles the signals RE and /RE. When a set including the command "X1h" and the address ADD is stored in the register 25 of each of the semiconductor storage devices 4A to 4D, the sequencer 26 of each of the semiconductor storage devices 4A to 4D controls the input/output circuit 22, the logic control circuit 23, the register 25, and the like based on the signals RE and /RE to start the duty cycle correction process.

In the duty cycle correction process, the sequencer 26 controls the Ron control circuit 224 based on the control signal CNT1 to prevent the output of the signals from pads 31<7:0>, 31_dqs, and 31_bdqs. Therefore, the semiconductor storage devices 4A to 4D do not output significant signals DQS, /DQS, and DQ<7:0>.

Subsequently, the tester 5 successively issues a transfer command "YYh" and the address ADD of the correction result from the register 25 to the ROM area 24. The timing at which the tester 5 issues the transfer command "YYh" may be, for example, after a predetermined time has elapsed from the timing (for example, a predetermined time after the duty cycle correction process execution command "X1h" is issued) as a trigger, and may be after receiving notification that the duty cycle correction process has been completed from each of the semiconductor storage devices 4A to 4D.

When the set including the command "YYh" and the address ADD is stored in register 25 of each of the semiconductor storage devices 4A to 4D, the sequencer 26 of each of the semiconductor storage devices 4A to 4D controls the ROM area 24 and the register 25 to transfer the result of the duty cycle correction process stored in the register 25 to the ROM area 24.

When the transfer process of the correction result in each of the semiconductor storage devices 4A to 4D is completed, the tester 5 sets the signals /CE0 to /CE3 to "H" level to disable the semiconductor storage devices 4A to 4D.

Thus, the duty cycle correction process and the transfer process of the correction result are executed in parallel in the semiconductor storage devices 4A to 4D.

1.2.1.2 Duty Cycle Correction Process

Figure 12:
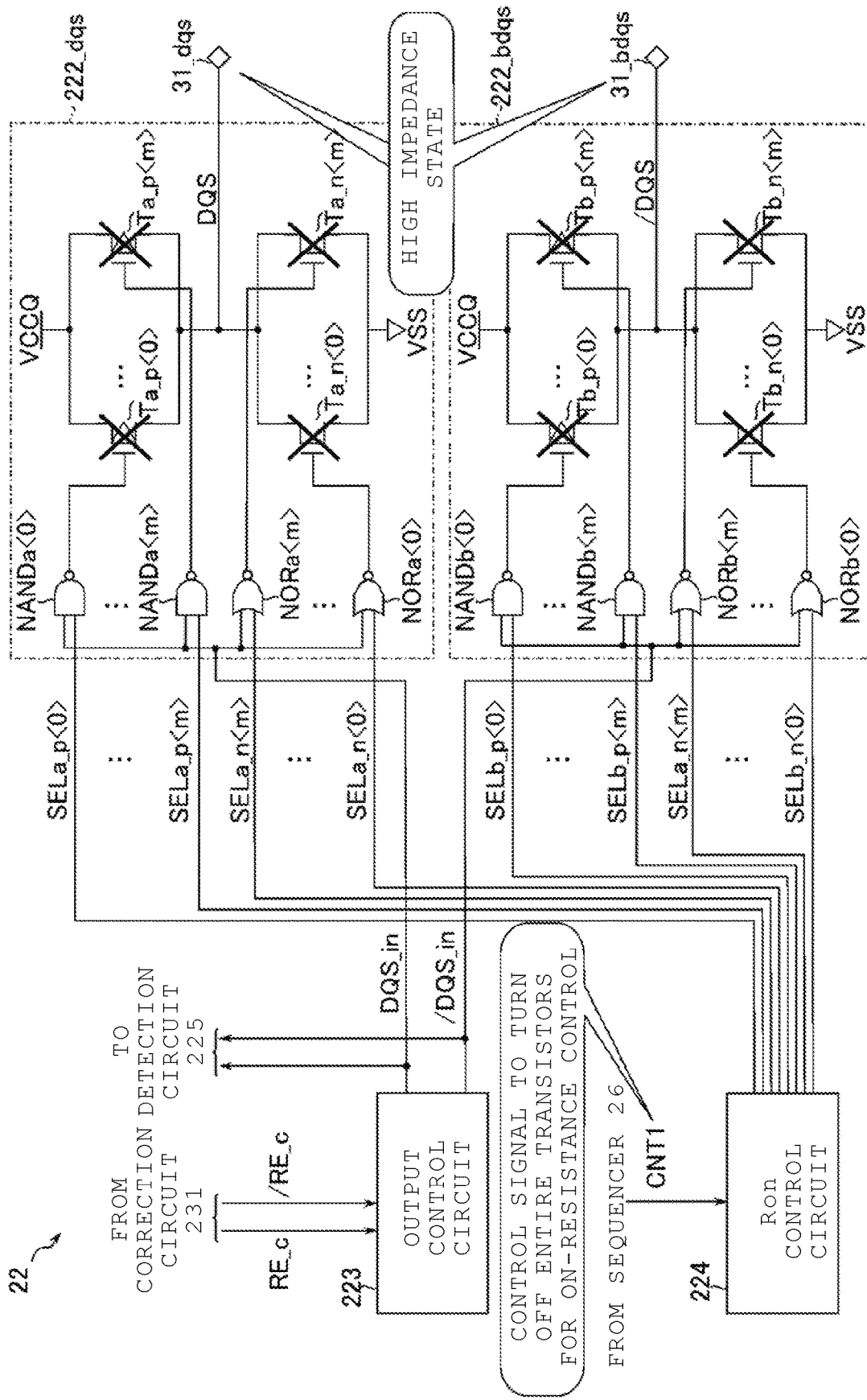
FIG. 12 is a schematic diagram illustrating an operation in the output circuit of the semiconductor storage device according to the first embodiment during the duty cycle correction process.

FIG. 12 is a schematic diagram illustrating an operation in an output circuit of the semiconductor storage device according to the first embodiment during the duty cycle correction process. Although FIG. 12 shows a portion related to the signals DQS and /DQS as an example, the following description on FIG. 12 is similarly applied to the signals DQ<7:0>.

As described above, during the duty cycle correction process, the duty cycle of the signals DQ, DQS and /DQS is corrected based on the signals RE and /RE. However, when the signals DQ, DQS, and /DQS are output, the signals DQ, DQS, and /DQS output from one of the semiconductor storage devices 4A to 4D may be input into another semiconductor storage device, which may affect duty cycle correction process. Therefore, when duty cycle correction process is simultaneously executed on a plurality of semiconductor storage devices 4A to 4D, it is preferable that the signals DQ, DQS, and /DQS be reduced to such an extent that the influence on the duty cycle correction process in other semiconductor storage devices can be ignored.

As shown in FIG. 12, during the duty cycle correction process, the sequencer 26 sends the control signal CNT1 to the Ron control circuit 224 so as to turn off all the transistors Ta_p<0> to Ta_p<m>, Ta_n<0> to Ta_n<m>, Tb_p<0> to Tb_p<m>, and Tb_n<0> to Tb_n<m> for on-resistance control. As a result, the pads 31_dqs and 31_bdqs are electrically disconnected from any of the voltages VCCQ and VSS. As a result, the pads 31_dqs and 31_bdqs are in a high impedance state, and the output of the output signals DQS_in and /DQS_in from the output control circuit 223 to the outside of the semiconductor storage devices 4A to 4D is prevented.

Figure 13:
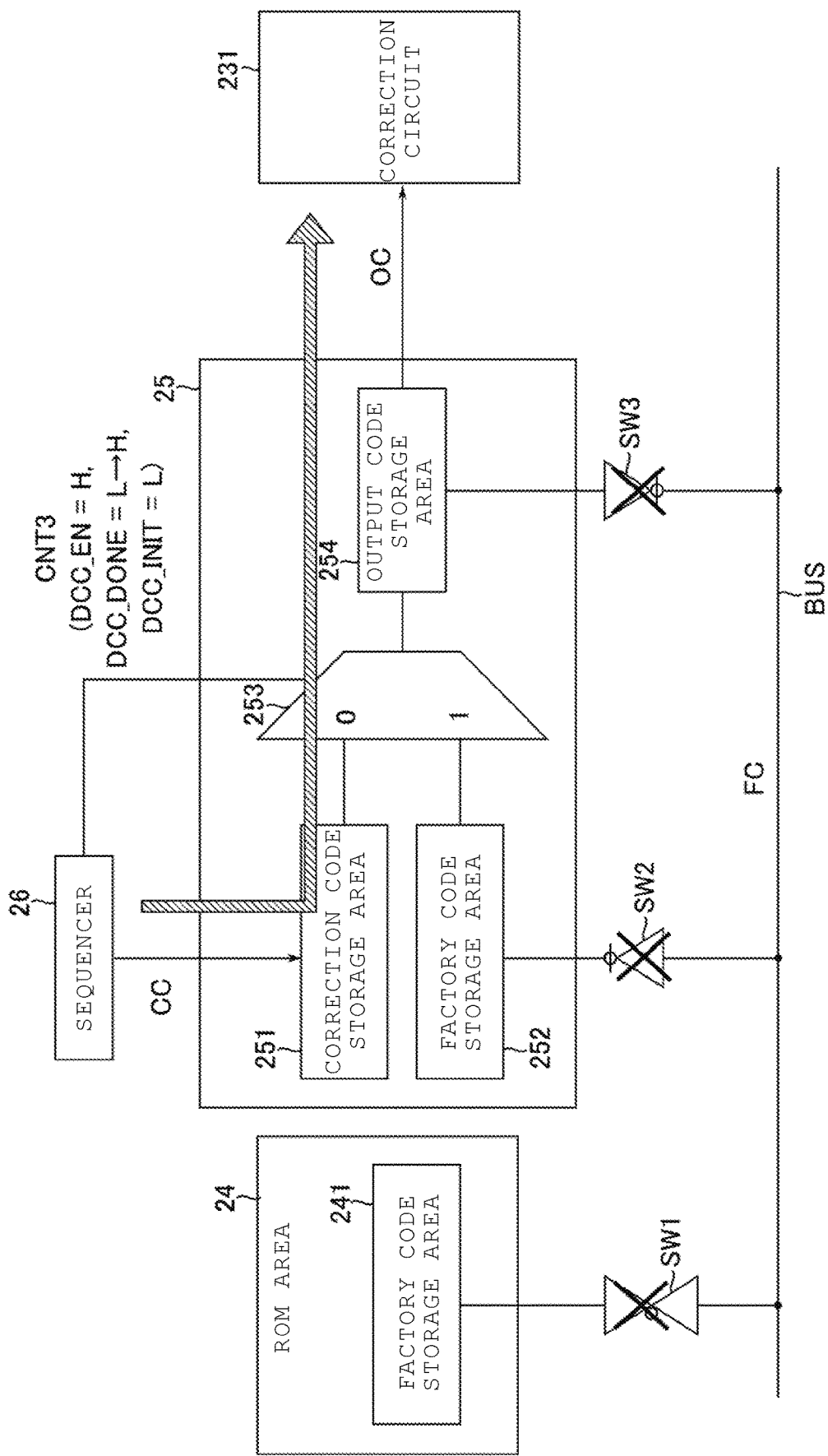
FIG. 13 is a schematic diagram illustrating an operation of the register and ROM area of the semiconductor storage device according to the first embodiment during the duty cycle correction process in the test phase.

FIG. 13 is a schematic diagram illustrating the operation of the register and ROM area of the semiconductor storage device according to the first embodiment during the duty cycle correction process in the test phase.

As shown in FIG. 13, in the test phase, since no valid data is stored in the factory code storage area 241, the register 25 does not communicate with the ROM area 24. Therefore, the switches SW1 to SW3 are turned off.

During the duty cycle correction process, the sequencer 26 generates a signal CC indicating a correction code based on the signal FLG, sends the signal CC to the correction code storage area 251, and generates a control signal CNT3 to control the multiplexer 253.

More specifically, during the duty cycle correction process, the sequencer 26 sends the control signal DCC_EN at "H" level and the control signal DCC_INIT at "L" level. The sequencer 26 sends the control signal DCC_DONE at "L" level until the correction code is determined, and sends the control signal DCC_DONE at "H" level after the correction code is determined. In any case, the multiplexer 253 selects the control value "0" based on the control signal CNT3, and sends the correction code to the output code storage area 254. As a result, the finally determined correction code is stored in the output code storage area 254 (and the correction code storage area 251).

1.2.1.3 Transfer Process of Duty Cycle Correction Result

Figure 14:
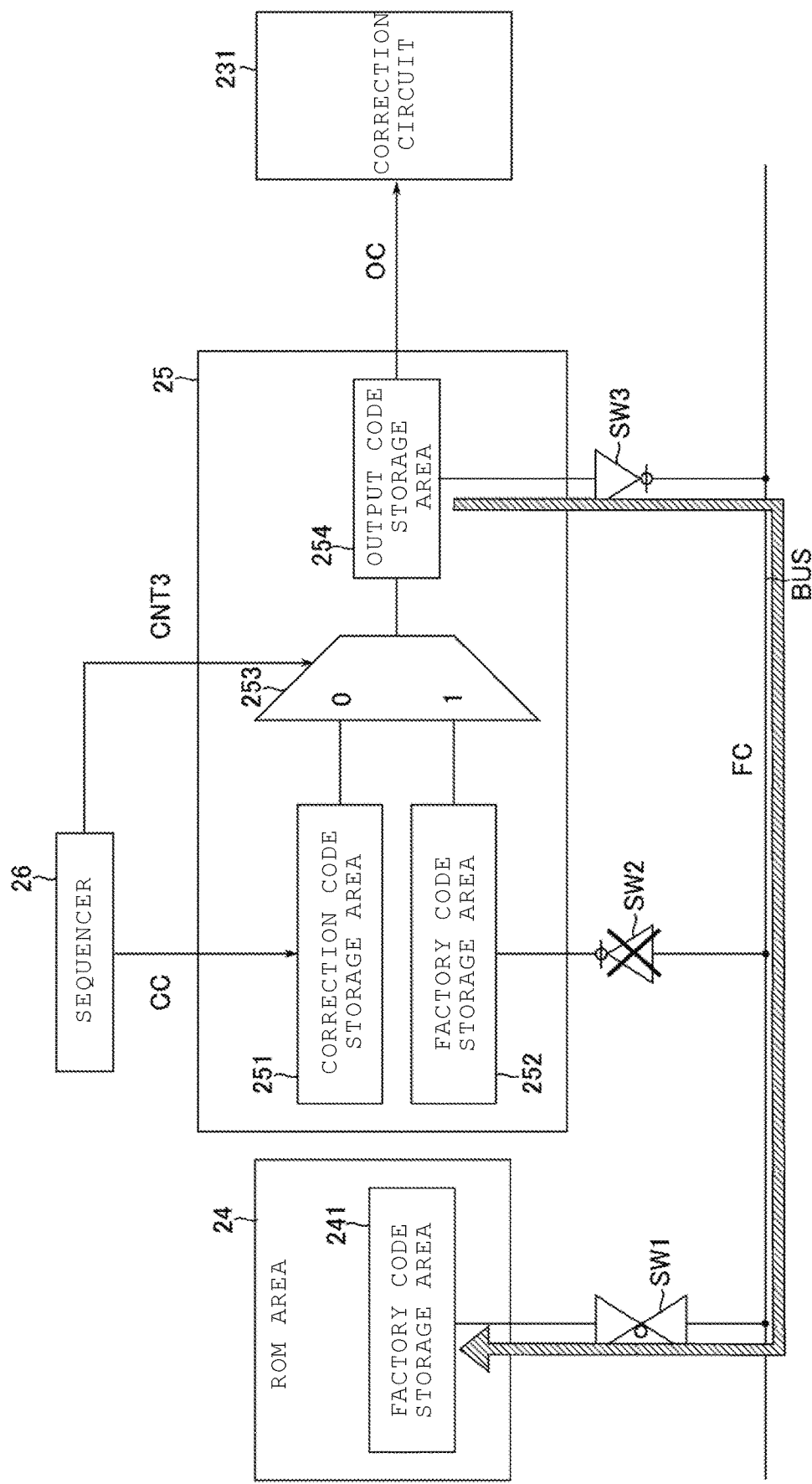
FIG. 14 is a schematic diagram illustrating an operation of the register and ROM area of the semiconductor storage device according to the first embodiment during the correction result transfer process in the test phase.

FIG. 14 is a schematic diagram illustrating an operation of the register and ROM area of the semiconductor storage device according to the first embodiment during a correction result transfer process in the test phase.

As shown in FIG. 14, after completion of the duty cycle correction process, the output code storage area 254 stores the determined correction code. The sequencer 26 transfers the correction code stored in the output code storage area 254 to the factory code storage area 241 in the ROM area 24 as the signal FC via the bus BUS by turning off the switch SW2 and turning on the switches SW3 and SW1. Thus, the factory code is stored in the factory code storage area 241 in a non-volatile manner, and the factory code can be used even after the shipment of the memory system 1.

1.2.2 Production Phase

Next, the operation in a production phase corresponding to the memory system 1 shipped will be described. In the production phase, the semiconductor storage devices 4A to 4D are packaged together with the memory controller 2 and used by a user in a state assembled as the memory system 1. In the following description, in the production phase, each of the semiconductor storage devices 4A to 4D is connected to the memory controller 2 via the NAND interface.

1.2.2.1 Overview

Figure 15:
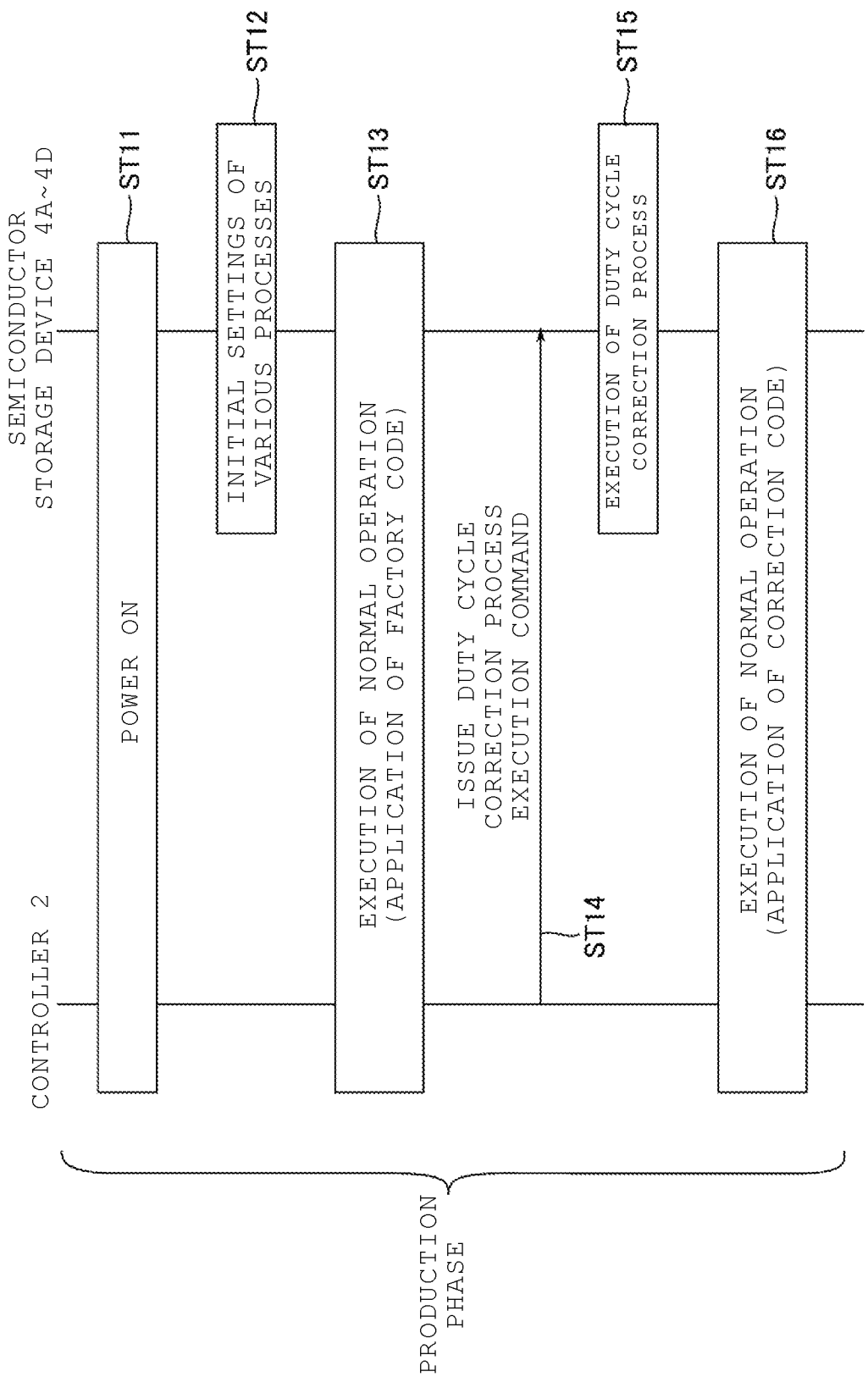
FIG. 15 is a flowchart of a duty cycle correction process in a production phase of the memory system according to the first embodiment.

FIG. 15 is a flowchart of a duty cycle correction process in a production phase of the semiconductor storage device according to the first embodiment.

As shown in FIG. 15, in step ST11, the memory controller 2 and the semiconductor storage devices 4A to 4D are powered on. Thus, the production phase starts. At the start of the production phase, the result of the duty cycle correction process in the test phase is lost from the register 25, but is stored as the factory code in the ROM area 24.

In step ST12, the semiconductor storage devices 4A to 4D execute, for example, a power-on read operation and perform initialization of various processes. As a result, the factory code stored in the ROM area 24 can be applied to subsequent input/output processes.

In step ST13, a normal operation (for example, a write operation, a read operation, and the like) is executed. In the normal operation, the factory code set in step ST12 is applied to correct the duty cycle of the signals DQ<7:0>, DQS, and /DQS.

In step ST14, the memory controller 2 issues a command (duty cycle correction process execution command) to execute the duty cycle correction process and sends the command to the semiconductor storage devices 4A to 4D.

In step ST15, each of the semiconductor storage devices 4A to 4D executes the duty cycle correction process upon receiving the duty cycle correction process execution command. Thereby, each of the semiconductor storage devices 4A to 4D can store the result of the duty cycle correction process in the internal register 25.

In step ST16, a normal operation is executed. In the normal operation, the correction code obtained by the duty cycle correction process executed in step ST15 is applied to correct the duty cycle of the signals DQ<7:0>, DQS, and /DQS.

Thus, a series of processes in the production phase is completed.

1.2.2.2 Before Execution of Duty Cycle Correction Process

Figure 16:
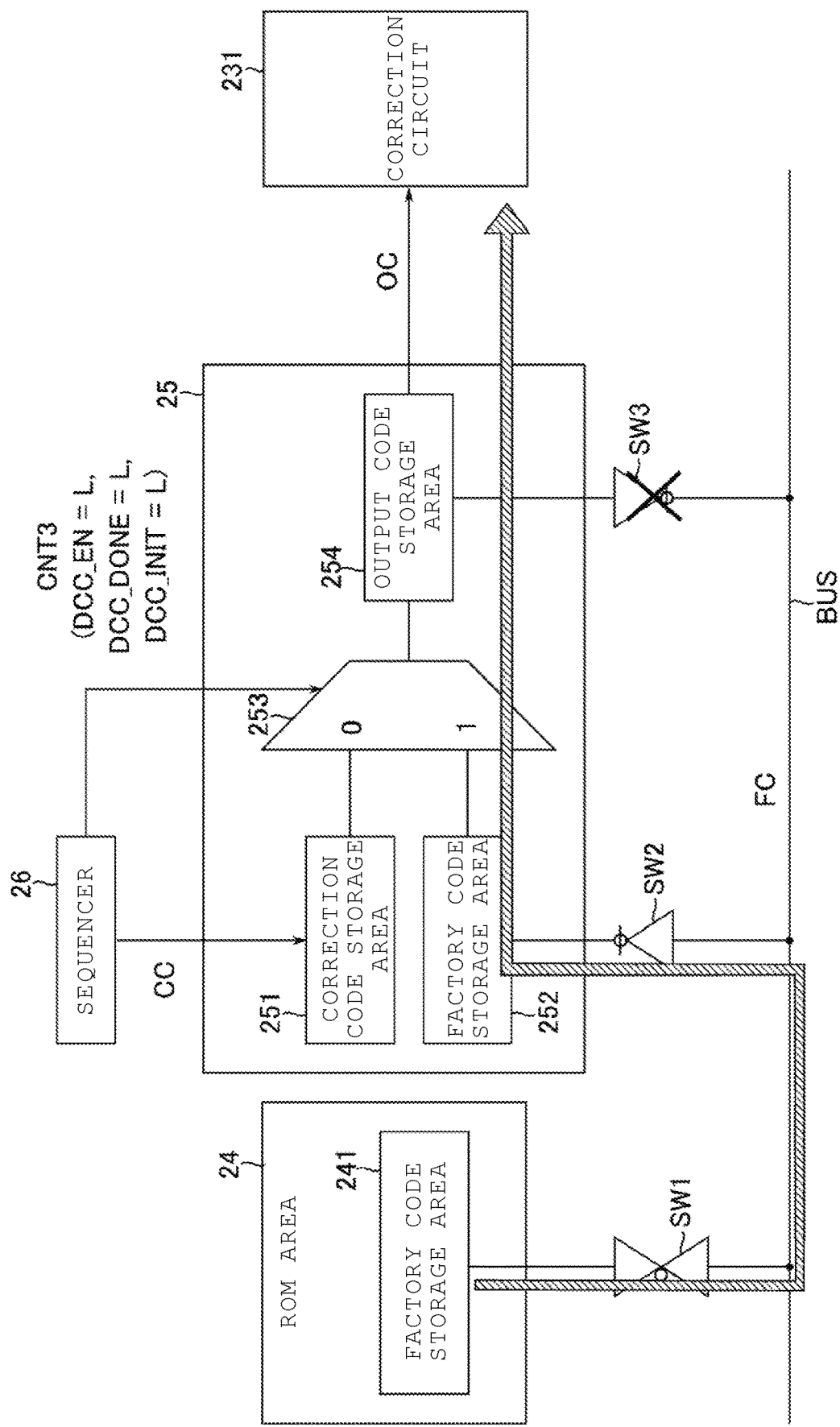
FIG. 16 is a schematic diagram illustrating an operation of the register and ROM area of the semiconductor storage device according to the first embodiment before execution of the duty cycle correction process in the production phase.

FIG. 16 is a schematic diagram illustrating an operation of the register and ROM area of the semiconductor storage device according to the first embodiment before execution of the duty cycle correction process in the production phase.

As shown in FIG. 16, in the production phase, the correction code is not stored in the correction code storage area 251 (the correction code is invalid) until the duty cycle correction process is executed. On the other hand, the factory code storage area 241 in the ROM area 24 stores the factory code stored in the test phase. The sequencer 26 transfers the factory code stored in the factory code storage area 241 in the ROM area 24 to the factory code storage area 252 in the register 25 as the signal FC via the bus BUS by setting the switch SW3 to the off state and setting the switches SW1 and SW2 to the on state. Thus, the factory code is temporarily stored in the factory code storage area 252.

The sequencer 26 cannot generate the signal CC until the duty cycle correction process is executed, and therefore generates only the control signal CNT3 to control the multiplexer 253.

More specifically, the sequencer 26 sends the control signals DCC_EN, DCC_DONE, and DCC_INIT which are all at "L" level. Thereby, the multiplexer 253 selects the control value "1" based on the control signal CNT3, and sends the factory code to the output code storage area 254.

By operating as described above, the factory code is stored in the output code storage area 254, and the factory code can be applied to correct the signals DQ<7:0>, DQS, and /DQS_in the normal operation.

1.2.2.3 During and After Execution of Duty Cycle Correction Process

Figure 17:
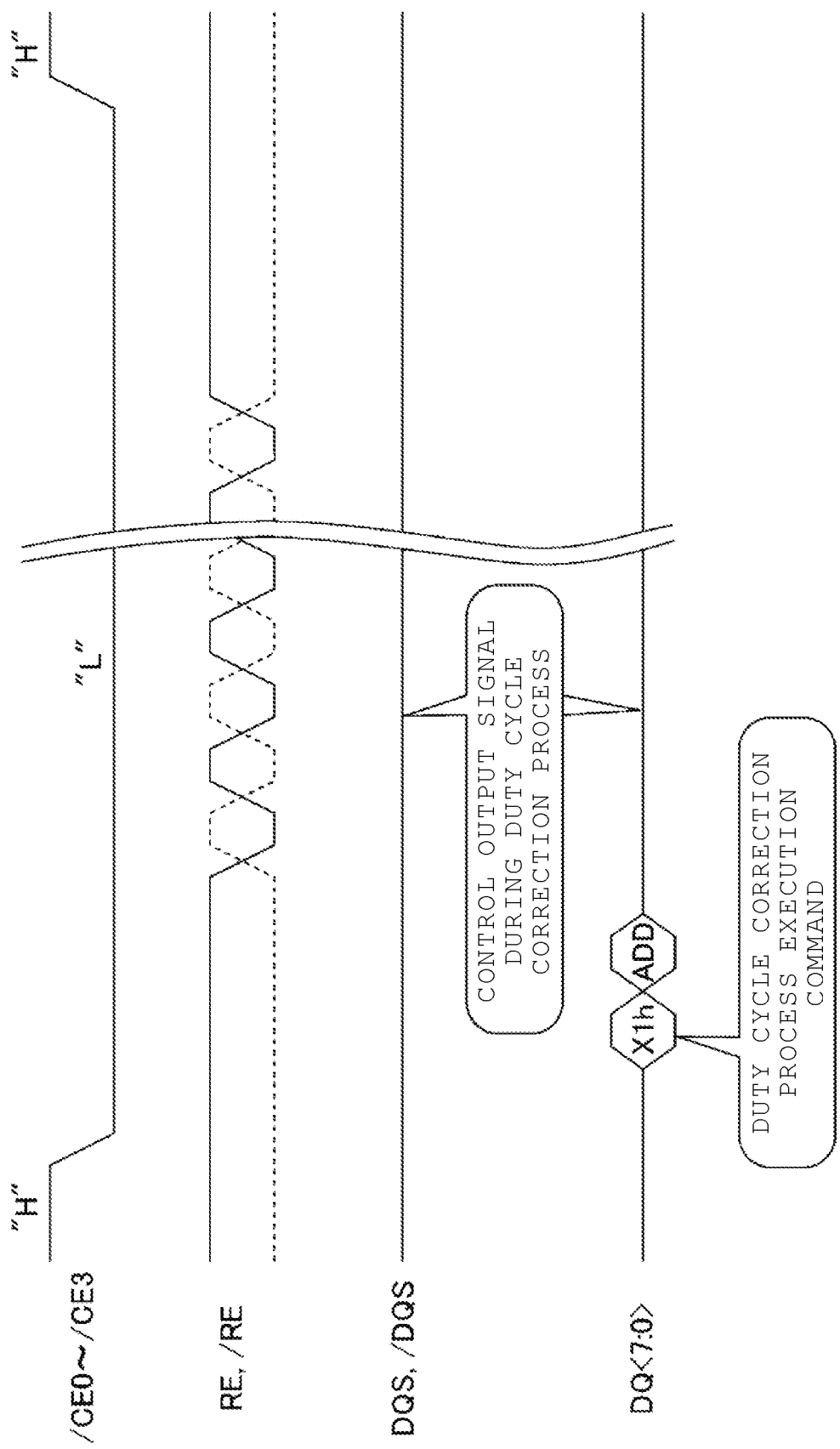
FIG. 17 is a command sequence for the duty cycle correction process in the production phase of the memory system according to the first embodiment.

FIG. 17 is a command sequence for a duty cycle correction process in the production phase of the memory system according to the first embodiment.

As shown in FIG. 17, the duty cycle correction process in the production phase does not involve the transfer process of the correction result to the ROM area 24.

Specifically, the memory controller 2 sets the signals /CE0 to /CE3 to "L" level to enable all semiconductor storage devices 4A to 4D.

The memory controller 2 successively issues the duty cycle correction process execution command "X1h" and the address ADD.

Subsequently, the memory controller 2 toggles the signals RE and /RE. When a set including the command "X1h" and the address ADD is stored in the register 25 of each of the semiconductor storage devices 4A to 4D, the sequencer 26 of each of the semiconductor storage devices 4A to 4D controls the input/output circuit 22, the logic control circuit 23, the register 25, and the like based on the signals RE and /RE to start the duty cycle correction process.

In the duty cycle correction process, the sequencer 26 controls the Ron control circuit 224 based on the control signal CNT1 to prevent the output of the signals from pads 31<7:0>, 31_dqs, and 31_bdqs.

When the duty cycle correction process in each of the semiconductor storage devices 4A to 4D is completed, the memory controller 2 sets the signals /CE0 to /CE3 to "H" level to disable the semiconductor storage devices 4A to 4D.

Thus, the duty cycle correction process for all the semiconductor storage devices 4A to 4D is completed.

Figure 18:
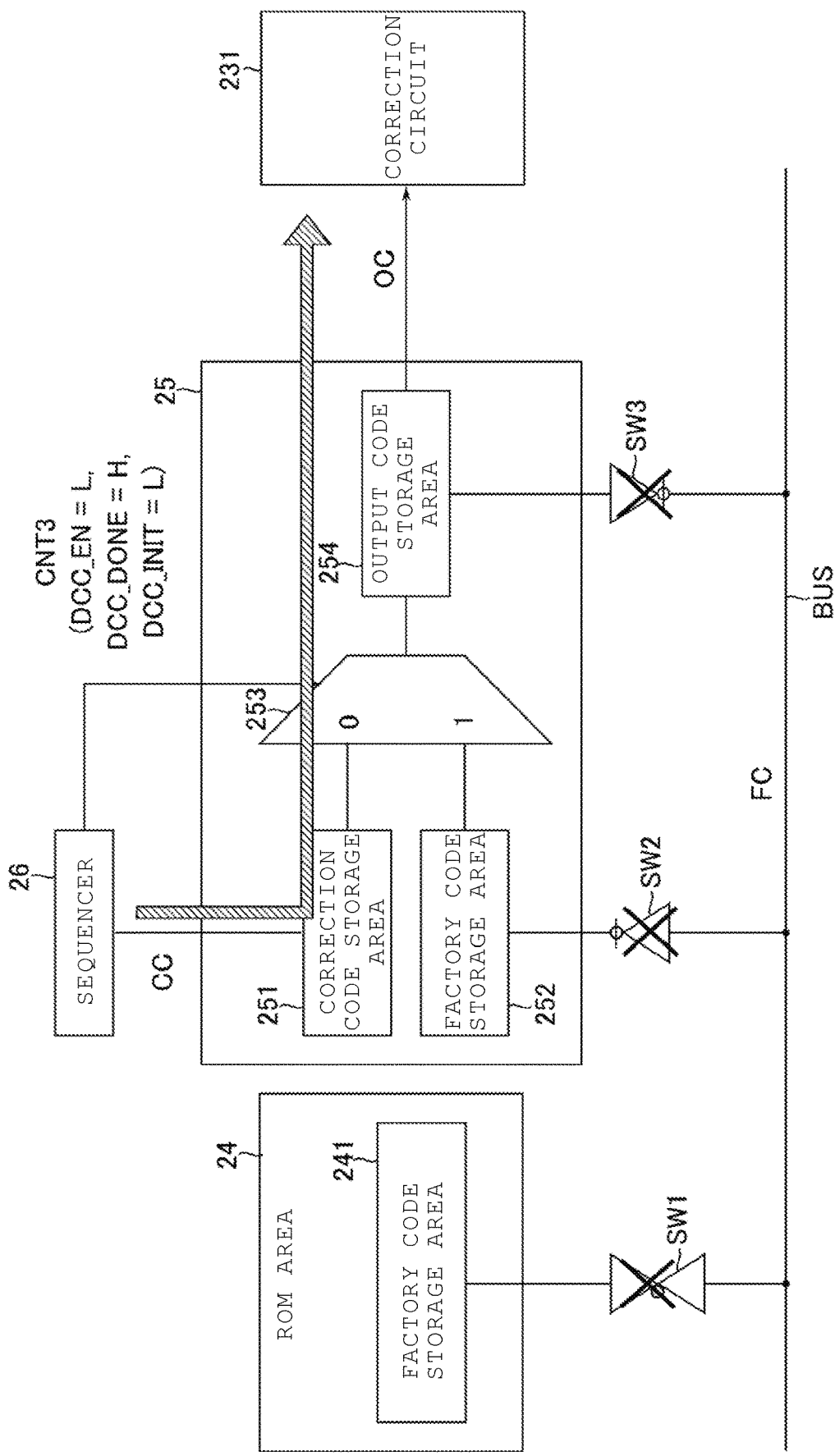
FIG. 18 is a schematic diagram illustrating an operation of the register and ROM area of the semiconductor storage device according to the first embodiment after execution of the duty cycle correction process in the production phase.

FIG. 18 is a schematic diagram illustrating an operation of the register and ROM area of the semiconductor storage device according to the first embodiment after execution of the duty cycle correction process in the production phase.

As shown in FIG. 18, after the duty cycle correction process is executed in the production phase, valid data is stored in the correction code storage area 251. Therefore, the duty cycle can be corrected without using the factory code. Therefore, communication between the ROM area 24 and the register 25 is not necessary, and the switches SW1 to SW3 are turned off.

The sequencer 26 generates information CC indicating a correction code based on the signal FLG during duty cycle correction process, sends the information CC to the correction code storage area 251, and generates a control signal CNT3 to control the multiplexer 253.

More specifically, after execution of the duty cycle correction process, the sequencer 26 sends the control signal DCC_EN at "L" level, sends the control signal DCC_DONE at "H" level, and sends the control signal DCC_INIT at "L" level. Thereby, the multiplexer 253 selects the control value "0" based on the control signal CNT3 and sends the correction code to the output code storage area 254. Therefore, the correction code is stored in the output code storage area 254.

By operating as described above, a correction code is stored in the output code storage area 254, and the correction code can be applied to correct the signals DQ<7:0>, DQS, and /DQS_in the normal operation.

1.3 Effect of Present Embodiment

According to the first embodiment, the time required for the duty cycle correction can be shortened. The effect is described below.

The memory controller 2 is configured to be able to control the plurality of semiconductor storage devices (chips) 4A to 4D. That is, the semiconductor storage devices 4A to 4D are configured to be able to receive the signals DQ<7:0> including the same command via the common signal line. The semiconductor storage devices 4A to 4D are configured to be able to receive the same signals RE and /RE via the common signal line. When receiving the same command "X1h" and the address ADD from the memory controller 2, each of the semiconductor storage devices 4A to 4D executes the duty cycle correction process in parallel with each other based on the signals RE and /RE. Thus, the time for executing the duty cycle correction process in the entire NAND package 3 can be shortened compared to the case where the duty cycle correction process is executed in series for each chip.

Further, during the duty cycle correction process, each of the semiconductor storage devices 4A to 4D is configured to put the pads 31<7:0>, 31_dqs, and 31_bdqs in a high impedance state. Thus, the pads 31<7:0>, 31_dqs, and 31_bdqs can be electrically disconnected from the signal lines connected to the pad group. Therefore, it is possible to prevent the signals DQ<7:0>, DQS, and /DQS from being output to the outside of each of the semiconductor storage devices 4A to 4D. Therefore, the possibility that an output signal from one semiconductor storage device being input into another semiconductor storage device, which may adversely affect the duty cycle correction process, can be prevented.

In addition, each of the semiconductor storage devices 4A to 4D is configured to execute the transfer process of transferring the correction result from the register 25 to the ROM area 24 when receiving the same command "YYh" and the address ADD from tester 5 after executing the duty cycle correction process. As a result, each of the semiconductor storage devices 4A to 4D can execute the transfer process of the correction result to the ROM area 24 in parallel by one command. Therefore, it is possible to shorten the time for executing the transfer process in the entire NAND package 3 as compared to the case where the transfer process is executed in series for each chip.

2. Second Embodiment

Although the first embodiment describes the case where a dedicated period for executing the duty cycle correction process is provided, the present disclosure is not limited thereto. For example, the duty cycle correction process may be executed in parallel with other processes. The second embodiment differs from the first embodiment in that the duty cycle correction process is executed without requiring a dedicated period. In the following description, the description of the same configuration and operation as the first embodiment is omitted, and the configuration and operation different from the first embodiment will be mainly described.

2.1 Duty Cycle Correction Process in Production Phase

In the following description, the case where a duty cycle correction process is executed on the remaining three chips in parallel with a read operation to be executed on one chip will be described.

Figure 19:
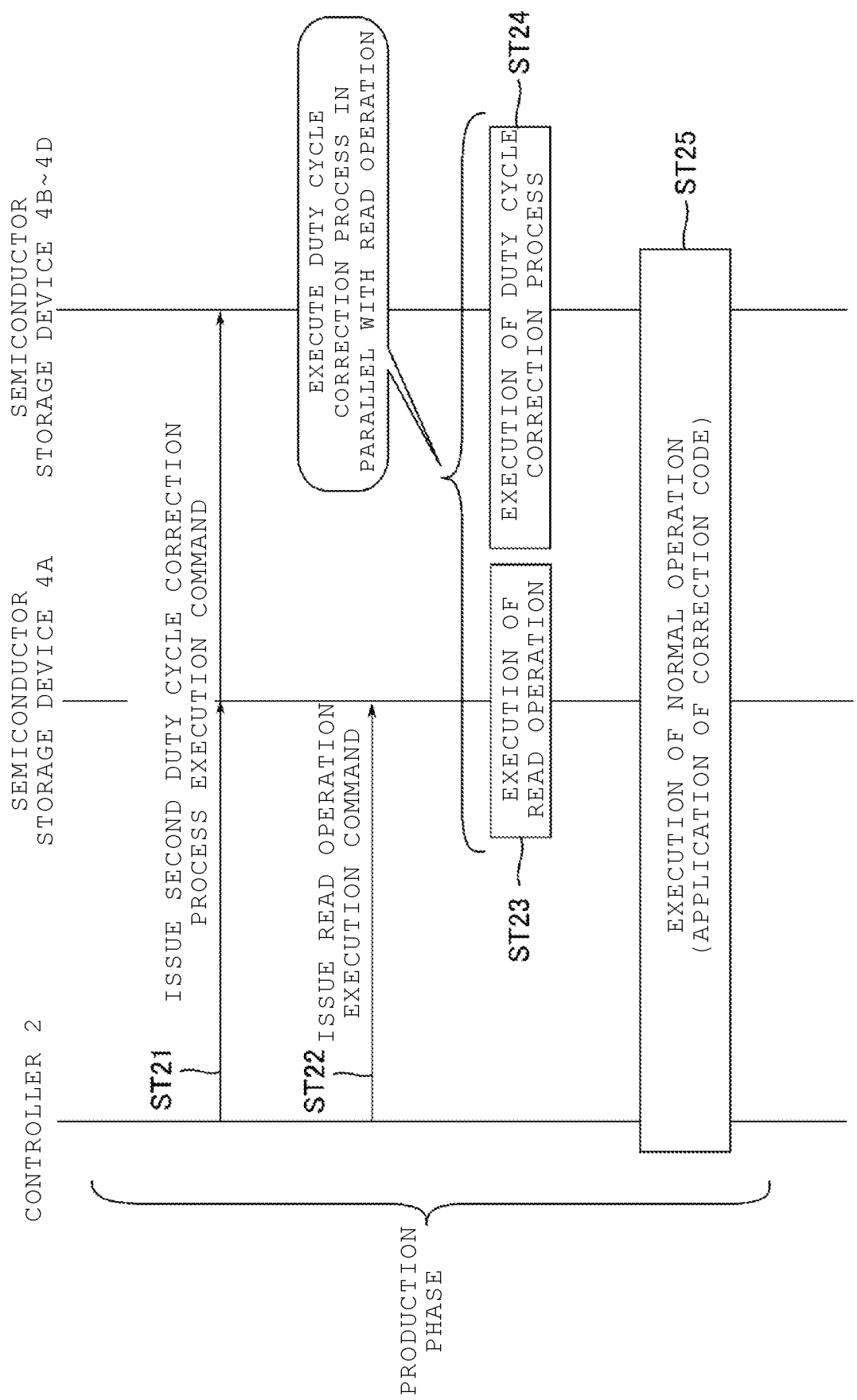
FIG. 19 is a flowchart of a duty cycle correction process in a production phase of a memory system according to a second embodiment.

FIG. 19 is a flowchart of a duty cycle correction process in a production phase of the semiconductor storage device according to the second embodiment. Steps ST21 to ST25 shown in FIG. 19 correspond to steps ST14 to ST16 in FIG. 15 described in the first embodiment.

As shown in FIG. 19, in step ST21, the memory controller 2 issues a command (second duty cycle correction process execution command) to execute a duty cycle correction process in parallel with a read operation, and sends the command to the semiconductor storage devices 4A to 4D. When receiving the second duty cycle correction process execution command, each of the semiconductor storage devices 4A to 4D recognizes that the duty cycle correction process is to be executed in parallel with a subsequent read operation to be executed by a chip other than itself.

In step ST22, the memory controller 2 issues a command (read operation execution command) to execute the read operation following step ST21 and sends the command to the semiconductor storage devices 4A to 4D. In the example of FIG. 19, the read operation execution command specifies the semiconductor storage device 4A as a chip to be read.

In step ST23, when receiving the read operation execution command, the semiconductor storage device 4A executes the read operation.

In step ST24, the semiconductor storage devices 4B to 4D execute the duty cycle correction process in parallel with the read operation of the semiconductor storage device 4A in step ST23. Thereby, each of the semiconductor storage devices 4B to 4D can execute the duty cycle correction process while data is read from the semiconductor storage device 4A, and store the result in the internal register 25.

In step ST26, a normal operation is executed. In the semiconductor storage devices 4B to 4D, the duty cycle of the signals DQ<7:0>, DQS, and /DQS is corrected by applying the correction code obtained by the duty cycle correction process executed in step ST24.

Thus, a series of processes in the production phase is completed.

Figure 20:
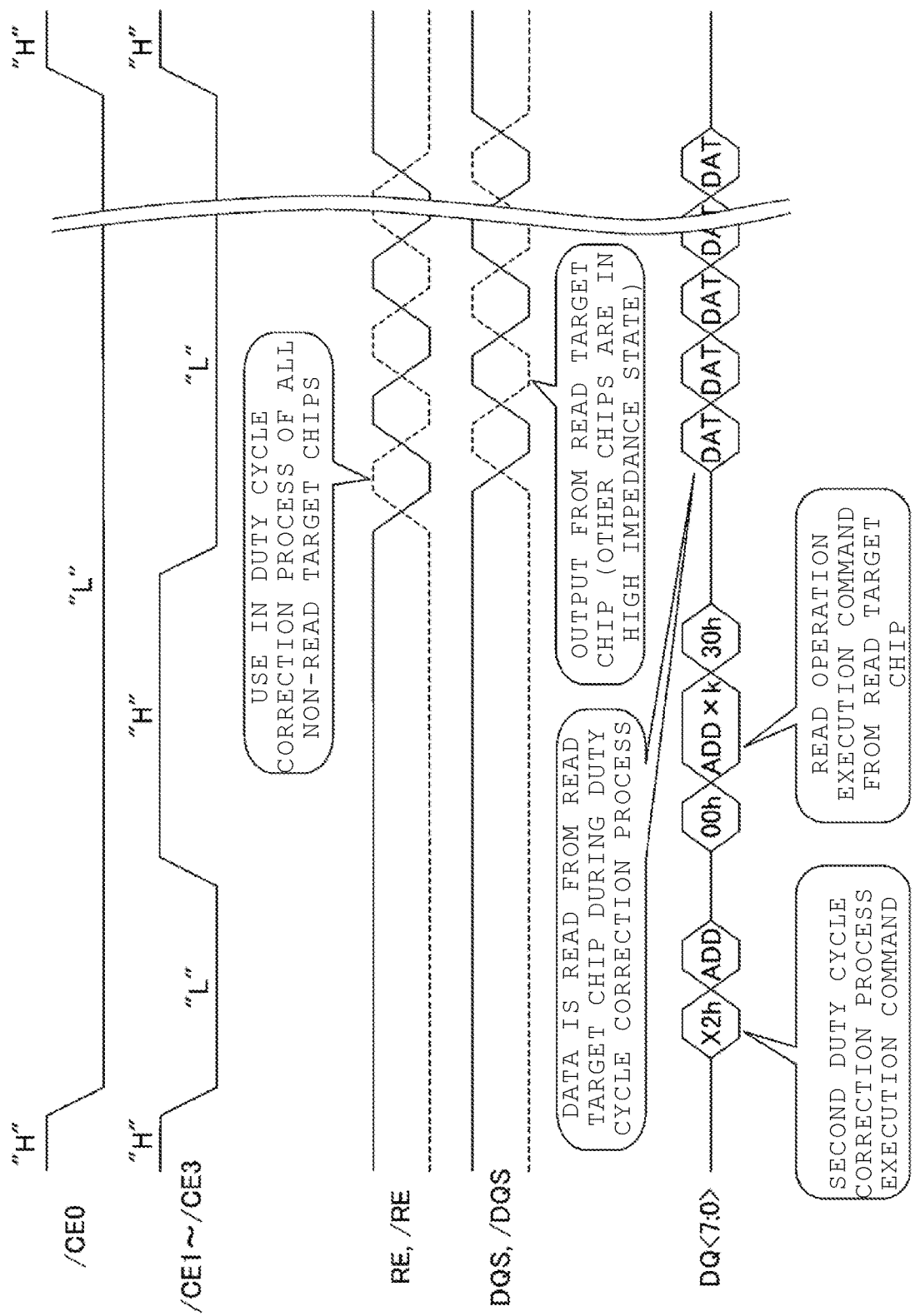
FIG. 20 is a command sequence for the duty cycle correction process in the production phase of the memory system according to the second embodiment.

FIG. 20 is a command sequence for the duty cycle correction process in the production phase of the memory system according to the second embodiment. The example of FIG. 20 corresponds to the flowchart shown in FIG. 19.

Specifically, the memory controller 2 sets the signals /CE0 to /CE3 to "L" level to enable all semiconductor storage devices 4A to 4D.

The memory controller 2 successively issues a second duty cycle correction process execution command "X2h" and the address ADD. When a set including the command "X2h" and the address ADD is stored in the register 25 of each of the semiconductor storage devices 4A to 4D, each of the semiconductor storage devices 4A to 4D waits until an instruction to read data from one of the chips comes. After the command "X2h" and the address ADD are sent to the semiconductor storage devices 4A to 4D, the memory controller 2 sets the signals /CE1 to /CE3 to "H" level to disable the semiconductor storage devices 4B to 4D.

Subsequently, the memory controller 2 issues a command "00h". The command "00h" is a command instructing read data. In the example of FIG. 20, since the memory controller 2 enables the semiconductor storage device 4A, the semiconductor storage device 4A recognizes that a data read command is received.

The memory controller 2 issues the address ADD for, for example, k cycles, and subsequently issues a command "30h" (k is any natural number). After issuing the command "30h", the memory controller 2 toggles the signals RE and /RE. Along with this, the sequencer 26 of the semiconductor storage device 4A reads data from the memory cell array 21 and outputs the data to the memory controller 2 as the signals DQ<7:0>.

In addition, after issuing the command "30h", before toggling the signals RE and /RE, the memory controller 2 sets the signals /CE1 to /CE3 to "L" level to re-enable the semiconductor storage devices 4B to 4D. When receiving the signals RE and /RE without receiving the set including the command "00h", the address ADD, and the command "30h", the semiconductor storage devices 4B to 4D control the input/output circuit 22, the logic control circuit 23, the register 25 and the like based on the signals RE and /RE to start a duty cycle correction process. Thereby, the semiconductor storage devices 4B to 4D can execute the duty cycle correction process while data is being read from the semiconductor storage device 4A.

When the data reading from the semiconductor storage device 4A is completed and the duty cycle correction process in each of the semiconductor storage devices 4B to 4D is completed, the memory controller 2 sets the signals /CE0 to /CE3 to "H" level to disable the semiconductor storage devices 4A to 4D.

As described above, the duty cycle correction process to be executed by the semiconductor storage devices 4B to 4D is completed in parallel with the data read operation from the semiconductor storage device 4A.

2.3 Effect According to Present Embodiment

According to the second embodiment, when receiving the same command "X2h" and the address ADD from the memory controller 2, each of the semiconductor storage devices 4A to 4D recognizes that the duty cycle correction process is to be executed in parallel with a read operation in the subsequent read operation from a certain chip. That is, among the semiconductor storage devices 4A to 4D, one chip which received a read command as a read target chip after the command "X2h" and the address ADD executes a read operation as usual. On the other hand, among the semiconductor storage devices 4A to 4D, a plurality of remaining chips that did not receive a read command as read target chips after the command "X2h" and the address ADD use the signals RE and /RE sent from the memory controller 2 along with the read operation to execute the duty cycle correction process in parallel with the read operation. As a result, since the duty cycle correction process can be executed in parallel with a normal operation such as the read operation, the time required for the duty cycle correction process can be further shortened. In addition, since the duty cycle correction process of a plurality of non-read target chips can be executed in parallel, the time for executing the duty cycle correction process in the entire NAND package 3 can be shortened compared to the case of executing the duty cycle correction process one by one (in series).

Further, during the duty cycle correction process executed in parallel with the read operation, each of the non-read target chips of the semiconductor storage devices 4A to 4D is configured to put the pads 31<7:0>, 31_*dqs*, and 31_*bdqs* in a high impedance state. Thus, the pads 31<7:0>, 31_*dqs*, and 31_*bdqs* of the non-read target chip can be electrically disconnected from the signal lines connected to the pad group.

Therefore, the influence of the signals DQ<7:0>, DQS, and /DQS on the read data output from the read target chip can be reduced.

3. Other

In addition, the following modifications can be suitably applied to the embodiment.

For example, in the first embodiment described above, the command "YYh" for executing the transfer process has been described as being issued by the tester 5, but the subject issuing the command is not limited to the tester 5 and may be the memory controller 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first chip that includes a non-volatile first storage region, a volatile first memory, a first bus that electrically connects the first storage region and the first memory, a first switch electrically connected between the first storage region and the first bus, and a second switch electrically connected between the first memory and the first bus, wherein the first switch is configured to allow a signal to be communicated from the first bus to the first storage region and from the first storage region to the first bus and the second switch is configured to allow a signal to be communicated from the first bus to the first memory; and
   a second chip that includes a non-volatile second storage region, a volatile second memory, a second bus that electrically connects the second storage region and the second memory, a third switch electrically connected between the second storage region and the second bus, and a fourth switch electrically connected between the second memory and the second bus, wherein the third switch is configured to allow a signal to be communicated from the second bus to the second storage region and from the second storage region to the second bus and the fourth switch is configured to allow a signal to be communicated from the second bus to the second memory, wherein
   in response to a first command that is received on a first terminal of the first chip and a second terminal of the second chip that are connected to a command signal line, the first chip and the second chip execute in parallel a first correction process of correcting a duty cycle of a first output signal generated by the first chip and a second correction process of correcting a duty cycle of a second output signal generated by the second chip, according to a common toggle signal.

2. The semiconductor storage device according to claim 1, wherein
   the first chip includes a third terminal through which the common toggle signal is received and the second chip includes a fourth terminal through which the common toggle signal is received.

3. The semiconductor storage device according to claim 2, wherein
   the first chip includes a fifth terminal through which the first output signal is to be output, the fifth terminal being connected to a first signal line, and the second chip includes a sixth terminal through which the second output signal is to be output, the sixth terminal also connected to the first signal line, and
   the first chip is configured to put the fifth terminal in a high impedance state during the first correction process, and the second chip is configured to put the sixth terminal in a high impedance state during the second correction process.

4. The semiconductor storage device according to claim 3, wherein
   the first chip includes a first transistor that is connected between a first power supply terminal and the fifth terminal and a second transistor that is connected between the fifth terminal and a first ground terminal, the first and second transistors being turned off during the first correction process to put the fifth terminal in the high impedance state, and
   the second chip includes a third transistor that is connected between a second power supply terminal and the sixth terminal and a fourth transistor that is connected between the sixth terminal and a second ground terminal, the third and fourth transistors being turned off during the second correction process to put the sixth terminal in the high impedance state.

5. The semiconductor storage device according to claim 1, wherein in response to a second command received after the first command, the first chip executes a process of storing first information indicating a correction result of the duty cycle of the first output signal in the first storage region, and the second chip executes a process of storing second information indicating a correction result of the duty cycle of the second output signal in the second storage region.

6. The semiconductor storage device according to claim 1, wherein first test-phase generated duty cycle correction information for correcting the duty cycle of the first output signal is stored in the first storage region and first production-phase generated duty cycle correction information for correcting the duty cycle of the first output signal is stored in the first memory, and second test-phase generated duty cycle correction information for correcting the duty cycle of the second output signal is stored in the second storage region and second production-phase generated duty cycle correction information for correcting the duty cycle of the second output signal is stored in the second memory.

7. The semiconductor storage device according to claim 1, wherein each of the first chip and the second chip includes:

a detection circuit that is configured to detect the duty cycle;

a sequencer that is configured to generate a control signal based on the duty cycle detected by the detection circuit; and a correction circuit that is configured to generate a signal in which the duty cycle of the toggle signal is corrected based on the control signal.

8. A semiconductor storage device comprising:

a first chip that includes a memory cell array and first and second terminals, the first chip further including a non-volatile first storage region, a volatile first memory, a first bus that electrically connects the first storage region and the first memory, a first switch electrically connected between the first storage region and the first bus, and a second switch electrically connected between the first memory and the first bus, wherein the first switch is configured to allow a signal to be communicated from the first bus to the first storage region and from the first storage region to the first bus and the second switch is configured to allow a signal to be communicated from the first bus to the first memory;

a second chip that includes a memory cell array and first and second terminals, the second chip further including a non-volatile second storage region, a volatile second memory, a second bus that electrically connects the second storage region and the second memory, a third switch electrically connected between the second storage region and the second bus, and a fourth switch electrically connected between the second memory and the second bus, wherein the third switch is configured to allow a signal to be communicated from the second bus to the second storage region and from the second storage region to the second bus and the fourth switch is configured to allow a signal to be communicated from the second bus to the second memory;

a third chip that includes a memory cell array and first and second terminals, the third chip further including a non-volatile third storage region, a volatile third memory, a third bus that electrically connects the third storage region and the third memory, a fifth switch electrically connected between the third storage region and the third bus, and a sixth switch electrically connected between the third memory and the third bus, wherein the fifth switch is configured to allow a signal to be communicated from the third bus to the third storage region and from the third storage region to the third bus and the sixth switch is configured to allow a signal to be communicated from the third bus to the third memory, wherein in response to first and second commands that are received over a common command signal line at the first terminals of the first, second, and third chips, two of the first, second, and third chips execute a process to correct a duty cycle of an output signal generated therein according to a common toggle signal, and one remaining chip executes a process to read data from the memory cell array and output the read data through the second terminal thereof.

9. The semiconductor storage device according to claim 8, wherein each of the first, second, and third chips includes a third terminal through which the common toggle signal is received.

10. The semiconductor storage device according to claim 9, wherein each of the first, second, and third chips includes a fourth terminal through which a corrected output signal is to be output, and each of said two of the first, second, and third chips is configured to put the fourth terminal thereof in a high impedance state during the process to correct the duty cycle of the output signal generated therein.

11. The semiconductor storage device according to claim 8, wherein test-phase generated duty cycle correction information for correcting the duty cycle of the output signal is stored in the non-volatile storage region of each of the first, second, and third chips.

12. The semiconductor storage device according to claim 11, wherein production-phase generated duty cycle correction information for correcting the duty cycle of the output signal is stored in the volatile memory of each of the first, second, and third chips.

13. The semiconductor storage device according to claim 8, wherein each of the first, second, and third chips includes:

a detection circuit that is configured to detect the duty cycle;

a sequencer that is configured to generate a control signal based on the duty cycle detected by the detection circuit; and a correction circuit that is configured to generate a signal in which the duty cycle of the toggle signal is corrected based on the control signal.

14. A memory system comprising:

a semiconductor storage device that includes a first chip and a second chip, the first chip further including a non-volatile first storage region, a volatile first memory, a first bus that electrically connects the first storage region and the first memory, a first switch electrically connected between the first storage region and the first bus, and a second switch electrically connected between the first memory and the first bus, wherein the first switch is configured to allow a signal to be communicated from the first bus to the first storage region and from the first storage region to the first bus and the second switch is configured to allow a signal to be communicated from the first bus to the first memory, and the second chip further including a non-volatile second storage region, a volatile second memory, a second bus that electrically connects the second storage region and the second memory, a third switch electrically connected between the second storage region and the second bus, and a fourth switch electrically connected between the second memory and the second bus, wherein the third switch is configured to allow a signal to be communicated from the second bus to the second storage region and from the second storage region to the second bus and the fourth switch is configured to allow a signal to be communicated from the second bus to the second memory; and a memory controller, wherein in response to a first command received from the memory controller over a first signal line, the first chip and the second chip execute in parallel a correction process of correcting a duty cycle of an output signal generated therein according to toggle signals received from the memory controller over second and third signal lines.

15. The memory system according to claim 14, wherein each of the first and second chips includes a first terminal through which the first command is received and second and third terminals through which the corrected output signal is to be output, and the memory controller has a first terminal connected to the first terminals of the first and second chips via a command signal line, a second terminal connected to the second terminals of the first and second chips via a fourth signal line, and a third terminal connected to the third terminals of the first and second chips via a fifth signal line.

16. The memory system according to claim 15, wherein each of the first and second chip is configured to put the second and third terminals thereof in a high impedance state during the correction process executed therein.

17. The memory system according to claim 14, wherein in response to a second command received after the first command, the first chip executes a process of storing first information indicating a correction result of the duty cycle of the first output signal in the first storage region, and the second chip executes a process of storing second information indicating a correction result of the duty cycle of the second output signal in the second storage region.

18. The memory system according to claim 14, wherein test-phase generated duty cycle correction information for correcting the duty cycle of the output signal is stored in the non-volatile storage region of each of the first and second chips.

19. The memory system according to claim 18, wherein production-phase generated duty cycle correction information for correcting the duty cycle of the output signal is stored in the volatile memory of each of the first and second chips.

20. The memory system according to claim 14, wherein each of the first and second chips includes:
a detection circuit that is configured to detect the duty cycle;
a sequencer that is configured to generate a control signal based on the duty cycle detected by the detection circuit; and
a correction circuit that is configured to generate a signal in which the duty cycle of the toggle signal is corrected based on the control signal.

* * * * *